US011017834B2

(12) United States Patent
Meier et al.

(10) Patent No.: US 11,017,834 B2
(45) Date of Patent: May 25, 2021

(54) REFRESH COMMAND MANAGEMENT

(71) Applicant: Micron Technology, Inc., Boise, ID (US)

(72) Inventors: Nathaniel J. Meier, Boise, ID (US); James S. Rehmeyer, Boise, ID (US); Sang-Kyun Park, Boise, ID (US); Makoto Kitayama, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 16/205,980

(22) Filed: Nov. 30, 2018

(65) Prior Publication Data

US 2020/0176047 A1 Jun. 4, 2020

(51) Int. Cl.
*G11C 11/406* (2006.01)
*G06F 3/06* (2006.01)
*G11C 11/22* (2006.01)

(52) U.S. Cl.
CPC ......... *G11C 11/406* (2013.01); *G06F 3/0619* (2013.01); *G06F 3/0659* (2013.01); *G06F 3/0673* (2013.01); *G11C 11/221* (2013.01); *G11C 11/225* (2013.01)

(58) Field of Classification Search
None
See application file for complete search history.

(56) References Cited

U.S. PATENT DOCUMENTS

| | | | | |
|---|---|---|---|---|
| 9,001,608 B1 * | 4/2015 | Chishti | ............. | G11C 11/40611 365/149 |
| 10,115,437 B1 * | 10/2018 | Yuan | ......................... | G11C 7/24 |
| 2006/0294294 A1 * | 12/2006 | Walker | ................ | G06F 13/1668 711/105 |
| 2012/0033519 A1 * | 2/2012 | Confalonieri | ...... | G11C 13/0004 365/222 |
| 2012/0224444 A1 | 9/2012 | Noh et al. | | |
| 2012/0300570 A1 * | 11/2012 | Kim | ....................... | G11C 7/222 365/222 |
| 2018/0101204 A1 | 4/2018 | Fackenthal | | |
| 2018/0197599 A1 | 7/2018 | Choi et al. | | |
| 2018/0342282 A1 * | 11/2018 | Morgan | ............... | G11C 29/023 |
| 2019/0121723 A1 * | 4/2019 | Walker | .................... | G06F 1/206 |
| 2019/0161341 A1 * | 5/2019 | Howe | .................. | B81B 7/0087 |

OTHER PUBLICATIONS

ISA/KR, International Search Report and Written Opinion of the International Searching Authority, Int'l. Appl. No. PCT/US2019/058139, dated Feb. 18, 2020, Korean Intellectual Property Office, Seo-gu, Daejeon, Republic of Korea, 11 pgs.

* cited by examiner

*Primary Examiner* — Charles Rones
*Assistant Examiner* — Ryan Dare
(74) *Attorney, Agent, or Firm* — Holland & Hart LLP

(57) ABSTRACT

Methods, systems, and devices for refresh command management are described. A memory device may conduct a refresh operation to preserve the integrity of data stored to one or more memory cells. In some examples, the frequency of refresh operations conducted may be based on the memory device's temperature and may be initiated based on one or more commands received from an external device (e.g., a host device). Each command may be transmitted by the host device at a defined rate, which may impact the rate at which the memory device conducts one or more refresh operations. The memory device may postpone or skip at least a portion of one or more refresh operations based on one or more operating parameters of the memory device.

25 Claims, 11 Drawing Sheets

REFRESH COMMAND MANAGEMENT

BACKGROUND

The following relates generally to refreshing a memory cell and more specifically to refresh command management.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device.

Improving memory devices, generally, may include increasing memory cell density, increasing read/write speeds, increasing reliability, increasing data retention, reducing power consumption, or reducing manufacturing costs, among other metrics. For example, some memory devices (e.g., some memory cells of memory devices) may be refreshed using one or more refresh operations to maintain data integrity.

DETAILED DESCRIPTION

Figure 1:
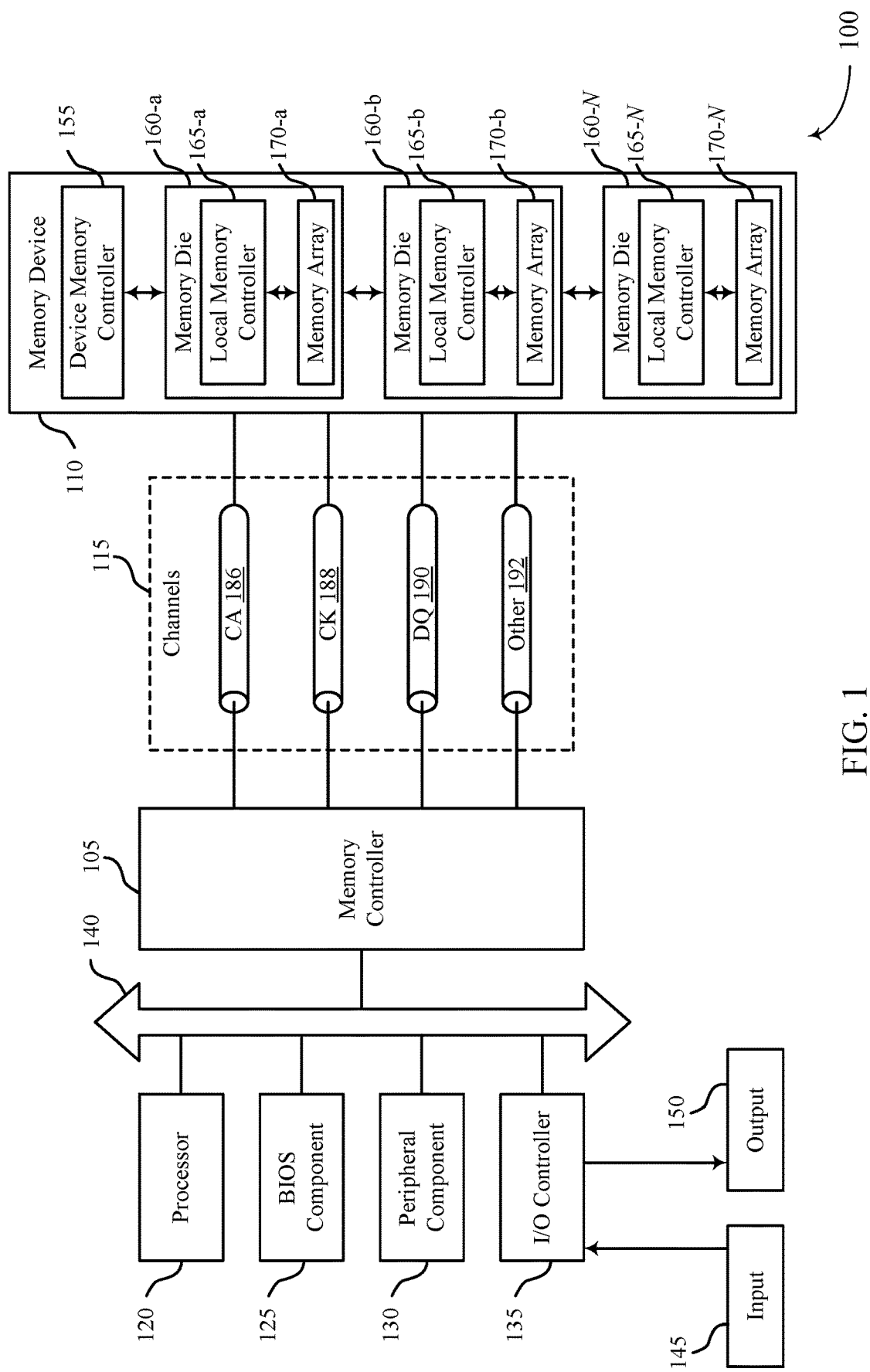
FIG. 1 illustrates an example of a system that supports refresh command management as disclosed herein.

A memory device may conduct a refresh operation to preserve the integrity of the data stored in the respective row of memory cells. In some examples, refresh operations may be used during operations of dynamic random-access memory (DRAM) memory cells and a frequency of refresh operations may be a function of a memory device's parameter, such as temperature. Stated another way, the temperature of a memory device may dictate a rate at which the memory device's memory cells are refreshed—e.g., the hotter the temperature of the memory device, the more frequent that refresh operations are conducted and vice versa. In some examples, an increased rate of refresh operations may result in increased power consumption by the memory device. In some examples, memory devices may be susceptible to reduced performance, failure, or both due to increased power consumption during a refresh operation. Thus, reducing the overall instantaneous power consumption of a single refresh operation may be desired.

In some examples, including DDR specifications (e.g., DDR4), an external device (e.g., a host device) may enable a temperature-controlled refresh (TCR) mode and issue one or more refresh commands to a memory device. The rate at which the external device transmits refresh commands to the memory device (e.g., tREFI) may be predefined based on a non-linear function. For example, the refresh commands (e.g., AREF commands) may be transmitted from the external device to a host device at a rate that is associated with a step function. As the temperature of the memory device changes (e.g., increases) at a first rate, the rate at which refresh commands are transmitted to the memory device may change (e.g., increase) at a second rate different than the first rate. In some temperature ranges, the memory device may be consuming power at a higher rate than what may be optimal. For example, a memory device having a temperature in a first temperature range (e.g., between 0° C. and 36° C.) may receive refresh commands at a first rate, whereas a memory device having a temperature in a second temperature range (e.g., between 37 C and 61 C) may receive refresh commands at a second refresh rate (e.g., a different refresh rate).

Accordingly, in some refresh operations, a memory device may receive refresh commands at a faster rate than necessary to preserve its data. Further, in a stacked configuration (e.g., multiple memory devices stacked or packaged together), a module configuration, or other configurations having a shared command bus, each memory device may receive a respective refresh command at a rate based on the temperature of the hottest memory device. Because an increased rate of refresh operations (e.g., receiving refresh commands at an increased rate) may result in increased power consumption, conducting unneeded refresh operations and/or basing a rate of refresh operations for multiple memory devices based on a temperature of the hottest device may unnecessarily increase the overall power consumption of a memory device or of a stack of memory devices.

As described herein, a refresh command may be initiated based on an external device transmitting a command (e.g., an AREF command) to the memory device at a predefined refresh rate (e.g., based on the temperature of the memory device). In some examples, a single refresh command may be configured to initiate a refresh operation on a plurality of rows of memory cells and may be associated with one or more individual "pumps." Each pump may, for example, be associated with one or more rows of memory cells to be refreshed. For example, a single refresh command may initiate a refresh operation including six pumps. Thus, the memory device may be configured to conduct a refresh operation on six or more different sets of rows of memory cells based on receiving a single refresh command from the host device—each pump may be configured to perform a refresh operation on one or more rows of memory cells. As used herein, an operation or activation of a pump may also be referred to as a "pump" or "pumping." During some refresh operations, the single refresh command may result in each of the six or more rows of memory cells being refreshed.

When multiple rows of memory cells are refreshed concurrently, a memory device may experience an increase in overall power consumption, as well as an increase in peak power consumption. For example, each refresh operation may contribute to an overall power consumption of the memory device during the refresh operation (e.g., 1.2 W), and each pump may contribute to the power consumption proportionally (e.g., each of six pumps may be associated with 0.2 W, for a total of 1.2 W). During some refresh operations, one or more refresh commands may be postponed or delayed by the host device (e.g., the host device may refrain from transmitting the refresh command). By skipping, postponing, or delaying a refresh command in its entirety, the memory device may experience a savings in its overall consumption (e.g., 1.2 W). Stated another way, the memory device may not consume as much power due to the refresh operation being altered. Conversely, when the refresh operation is conducted, the memory device may experience a higher amount of power consumption associated with the command (e.g., it may consume the entire 1.2 W). This may be referred to as the peak power consumption of the memory device (e.g., its highest power consumption). In some examples, repeated high peak power consumption of a memory device may lead to data loss or data corruption and, in some instances, complete system failure. Thus, mitigating the power consumption of the memory device at any one instant (e.g., its instantaneous power consumption) may, in turn, reduce the peak power consumption of the memory device.

To mitigate the peak power consumption of a memory device, one or more pumps associated with a refresh command may be postponed or skipped by the memory device. For example, a memory device may receive a refresh command from an external device that indicates that the memory device is to perform refresh operations for one or more pumps (e.g., one or more rows of memory cells). The refresh command may be transmitted at a rate that is based on the temperature of the memory device. Because the rate at which the commands are transmitted may be associated with a range of temperatures (e.g., between 0° C. and 36° C.), the refresh commands may be received at a same rate whether the temperature of the memory device is 1° C. or 35° C. Accordingly, the memory device may be configured to selectively postpone or skip one or more pumps associated with the refresh command based on the temperature of the memory device. Stated another way, the memory device may determine an optimal quantity of pumps to skip or postpone based on the device's operating temperature. By disabling one or more pumps, the overall power consumption and/or the peak power consumption associated with a refresh operation may be reduced.

In another example, one or more pumps associated with a refresh operation may be postponed or skipped based on one or more counters of the memory device. Stated another way, the memory device may include counters that are incremented based on particular operations being conducted or commands being received or a combination thereof. For example, the memory device may include a first counter for determining (e.g., counting) a quantity of refresh commands received from the external device. The memory device may also include a second counter for determining (e.g., counting) a quantity of refresh commands (e.g., SREF commands) generated internally. The memory device may postpone or skip one or more pumps associated with a refresh command based at least in part on a comparison between a count of refresh commands received from the external device and a count of self-refresh events generated by the memory device, internally.

In some examples, when the value of the first counter exceeds the value of the second counter may indicate that the memory device is being refreshed more-frequently than desired. Accordingly, this may indicate to the memory device that a less-frequent refresh operation may be used to maintain data integrity (e.g., that one or more pumps associated with the refresh command should be postponed or skipped). Conversely, when the value of the second counter exceeds the value of the first counter may indicate that the memory device is being refreshed less-frequently than desired. Accordingly, this may indicate to the memory device that one or more pumps associated with the refresh command may not be selectively postponed or skipped. As described herein, postponing or skipping one or more pumps may reduce the overall power consumption and/or peak power consumption of the memory device associated with the refresh operation, thereby causing the memory device to consume less power. In some cases, the postponing and the skipping may also be configured to prevent data loss, data corruption and, in some instances, complete system failure.

Features of the disclosure are initially described in the context of a system, a memory array, and memory devices with reference to FIGS. 1-4. Features of the disclosure are described in the context of a temperature diagram with reference to FIG. 5. These and other features of the disclosure are further illustrated by and described with reference to an apparatus diagram and flowcharts in FIGS. 6-11 that relate to refresh command management.

FIG. 1 illustrates an example of a system 100 that utilizes one or more memory devices in accordance with aspects disclosed herein. The system 100 may include an memory controller 105, a memory device 110, and a plurality of channels 115 coupling the memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the memory controller 105. In some cases, the memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including one or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the memory controller 105, the one or more memory dice 160, or the processor 120. In some cases, the memory device 110 may receive data and/or commands from the memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the memory controller 105, decoders for modulating and transmitting signals to the memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the memory controller 105 may perform the various functions described herein. As such, the local memory controller 165 may be configured to communicate with the device memory controller 155, with other local memory controllers 165, or directly with the memory controller 105 or the processor 120.

The memory controller 105 may be configured to enable communication of information, data, and/or commands between components of the system 100 (e.g., the processor 120) and the memory device 110. The memory controller 105 may act as a liaison between the components of the system 100 and the memory device 110 so that the components of the system 100 may not need to know the details of the memory device's operation. The components of the system 100 may present requests to the memory controller 105 (e.g., read commands or write commands) that the memory controller 105 satisfies. The memory controller 105 may convert or translate communications exchanged between the components of the system 100 and the memory device 110. In some cases, the memory controller 105 may include a system clock that generates a common (source) system clock signal. In some cases, the memory controller 105 may include a common data clock that generates a common (source) data clock signal.

In some cases, the memory controller 105 or other component of the system 100, or its functions described herein, may be implemented by the processor 120. For example, the memory controller 105 may be hardware, firmware, or software, or some combination thereof implemented by the processor 120 or other component of the system 100. While the memory controller 105 is depicted as being external to the memory device 110, in some cases, the memory controller 105, or its functions described herein, may be implemented by a memory device 110. For example, the memory controller 105 may be hardware, firmware, or software, or some combination thereof implemented by the device memory controller 155 or one or more local memory controllers 165. In some cases, the memory controller 105 may be distributed across the processor 120 and the memory device 110 such that portions of the memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the memory controller 105 (either separate from or as included in the processor 120).

In some examples, the controller 105 may be configured to transmit one or more commands (e.g., one or more AREF commands) to the memory device 110 based on one or more parameters (e.g., based on its operating temperature). In some examples, each AREF command may be associated with a refresh operation of the memory device 110. Before transmitting the commands, the controller 105 may receive an indication of the memory device's temperature (from, e.g., a mode register 325 as described with reference to FIG. 3) and may determine a rate at which to transmit the commands (e.g., tREFI). In some cases, the tREFI may be determined using information from an external temperature sensor that may be placed on the module, as a part of the support circuits RCD, SPD, etc., or elsewhere in the system. In other examples, the controller 105 may receive the rate at which to transmit the commands directly from the memory device 110 (e.g., from the mode register 325 as described with reference to FIG. 3). In some examples, the controller 105 may continually transmit the AREF commands to the memory device 110 at the determined rate until an updated rate is determined by either the controller 105 or the memory device 110.

The components of the system 100 may exchange information with the memory device 110 using a plurality of channels 115. In some examples, the channels 115 may enable communications between the memory controller 105 and the memory device 110. Each channel 115 may include one or more signal paths or transmission mediums (e.g., conductors) between terminals associated with the components of system 100. For example, a channel 115 may include a first terminal including one or more pins or pads at memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), and so forth.

In some cases, the channels 115 may include one or more command and address (CA) channels 186. The CA channels 186 may be configured to communicate commands between the memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any number of signal paths sufficient to decode necessary address and command data. In some examples, as designs for memory systems get larger, the quantity of CA signal paths may also get larger.

In some cases, the channels 115 may include one or more clock signal (CK) channels 188. The CK channels 188 may be configured to communicate one or more common clock signals between the memory controller 105 and the memory device 110. Each clock signal may be configured to oscillate between a high state and a low state and coordinate the actions of the memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the memory controller 105 and the memory device 110. The data clock signal may be configured to coordinate an access operation (e.g., a write operation or read operation) of the memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
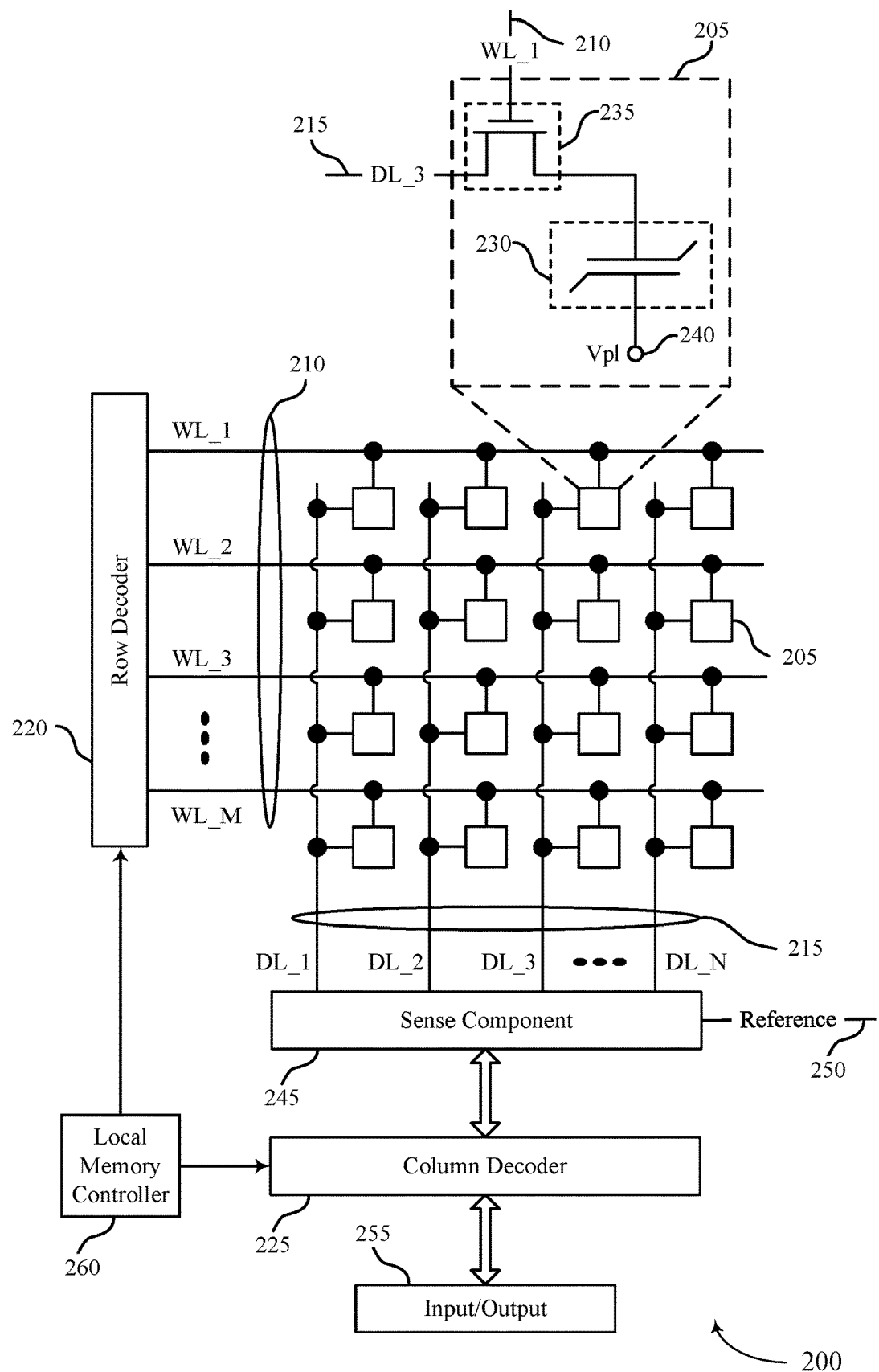
FIG. 2 illustrates an example of a memory die that supports refresh command management as disclosed herein.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may select a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an memory controller 105 (or a device memory controller 155 described with reference to FIG. 1), translate the commands and/or data into information that can be used by the memory die 200, perform one or more operations on the memory die 200, and communicate data from the memory die 200 to the memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the memory controller 105 (or the device memory controller 155) as part of the read operation.

Figure 3:
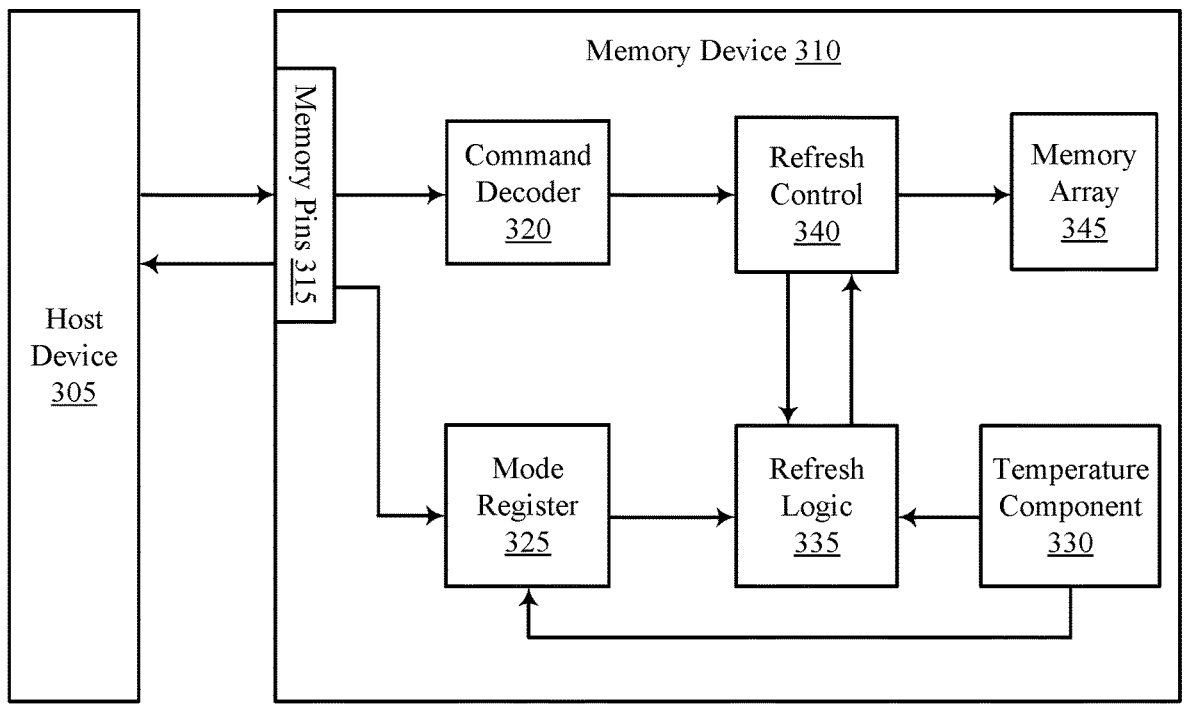
FIGS. 3 and 4 illustrate examples of systems that support refresh command management as disclosed herein.
Figure 4:
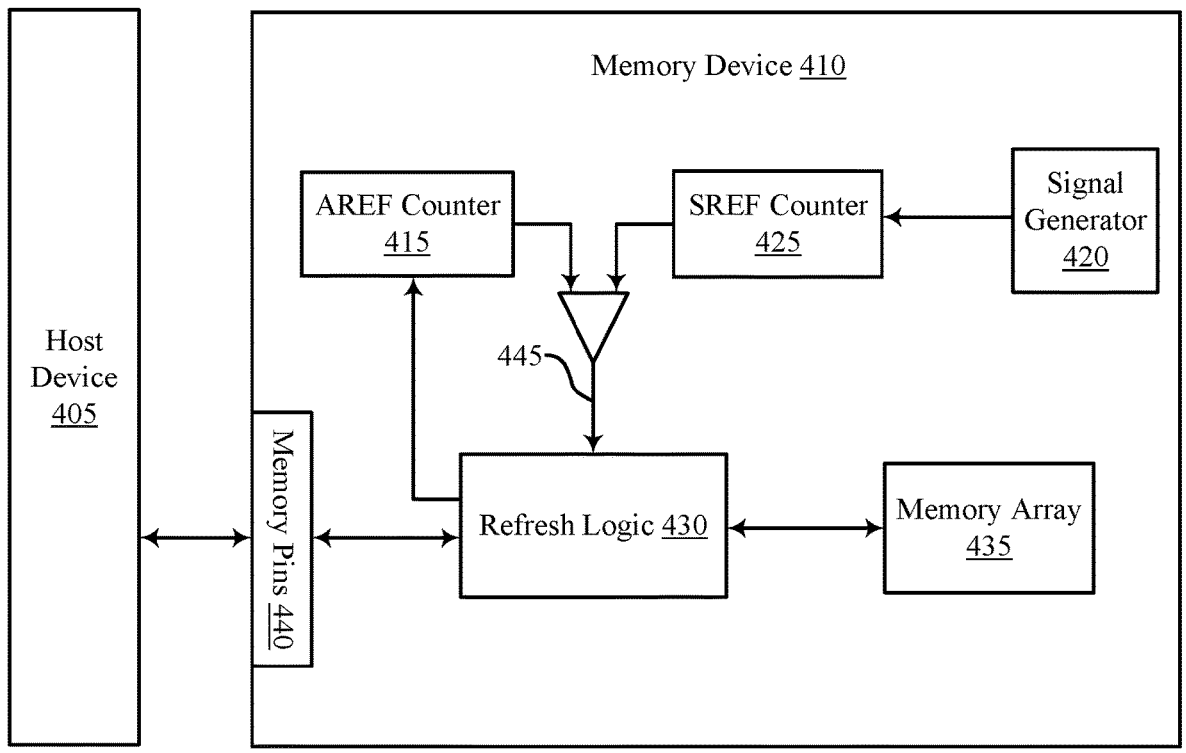

In some examples, the local memory controller 260 may perform one or more operations as described herein (e.g., with reference to FIGS. 3 and 4). For example, the local memory controller 260 may be configured to identify a plurality of events for the memory array 200 based at least in part on receiving the command from the host device (e.g., from the memory controller 105 as described with reference to FIG. 1). In some examples, the local memory controller 260 may be configured to determine a parameter for postponing one or more events of the plurality based at least in part on a temperature of the memory array 200 and receiving the command (e.g., from the memory controller 105 as described with reference to FIG. 1). Additionally or alternatively, the local memory controller 260 may be configured to refresh at least one memory cell 205 of the memory die based at least on part on the command and the parameter.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

FIG. 3 illustrates an example of a system 300 that supports refresh command management as disclosed herein. The system 300 may implement aspects of the system 100 and memory array 200 as described with reference to FIGS. 1 and 2. The system 300 may include a host device 305, which may implement aspects of an memory controller 105 as described with reference to FIG. 1. The system 300 may further include a memory device 310, which may be an example of a memory device 110 or the memory array 200 as described with reference to FIGS. 1 and 2. In some examples, the memory device 310 may be an example of a memory die or may be referred to as a memory die.

The memory device 310 may support refresh command management and thus may be configured to internally postpone or skip portions (e.g., pumps) of refresh command associated with the memory array 345. Stated another way, the memory device 310 may be configured to conduct a refresh operation at a desired rate (e.g., an updated rate) based on one or more internal processes. In some examples, the memory device 310 may include a command decoder 320, a mode register 325, and a temperature component 330. Additionally or alternatively, the memory device may include a refresh logic component 335 and a refresh control component 340. In some examples, the refresh logic component 335 and the refresh control component 340 may be a same component, or may be two individual components as described herein.

In some examples, the memory device 310 may be configured to internally postpone or skip one or more portions of a refresh command. Stated another way, the memory device 310 may be able to skip one or more events (e.g., pumps) of a refresh command received from the host device 305. Thus, the memory device 310 may, in effect, conduct an on-device (e.g., an on-die) TCR operation related to a TCR mode.

In order to internally adjust the refresh rate of one or more memory cells of the memory array 345 (e.g., in order to postpone or skip one or more pumps of a refresh command) the memory device 310 may receive a command from the host device 305. The command may be or may be referred to as a refresh command (e.g., an AREF command) and may be received over one or more memory pins 315. In order to refresh each of the rows of memory cells of the memory array 345, multiple refresh commands may be used. Stated another way, any one refresh command may be configured to cause a subset of the memory array 345 to be refreshed. Because each row of memory cells of the memory array 345 may be refreshed, multiple refresh commands may be transmitted between the host device 305 and the memory device 310. During any one refresh command, one or more refresh events (e.g., pumps) associated with the memory array 345 may be skipped and/or postponed.

In some examples, the memory pins 315 may include CA channels (e.g., CA channels 186 as described with reference to FIG. 1) and DQ channels (e.g., DQ channels 190 as described herein with reference to FIG. 1). As described herein, the memory device 310 may receive the refresh command via one or more CA channels and may read or write the associated data to and from the memory array 345 via one or more DQ channels.

The host device 305 may be configured to enable a TCR mode of the memory device 310. In some examples, a TCR mode may be enabled based on a temperature of the memory device 310 and may be associated with a predefined refresh rate (e.g., tREFI). For example, the temperature component 330 may periodically measure the temperature of the memory device 310 and may provide the temperature to the mode register 325. The mode register 325 may communicate, to the host device 305 (e.g., via the memory pins 315), the temperature of the memory device 310 and/or a predefined refresh rate (e.g., tREFI) based on the temperature of the memory device 310. Stated another way, in some examples the predefined refresh rate may be determined by the memory device 310 (e.g., by the mode register 325) and may be communicated to the host device 305. In some examples, the temperature of the memory device 310 may be measured by one or more external components (e.g., external to the memory device 310). For example, one or more temperature components may be located within support circuitry for the memory device 310. The temperature component(s) may periodically measure the temperature of the memory device, which may be utilized in determining (e.g., setting) tREFI.

In some examples, the mode register 325 may communicate the tREFI to the host device 305 via one or more memory pins 315 representative of one or more bits. These bits may be or may be referred to as MR4 bits. For example, the mode register 325 be configured to store a mode associated with a finite quantity of refresh rates (e.g., a finite quantity of modes) based on the temperature of the memory device 310. Each mode (e.g., each refresh rate) may dictate a rate at which AREF commands are transmitted from the host device 305 to the memory device 310. The quantity of total modes may dictate the quantity of MR4 bits transmitted to the host device 305. A greater quantity of total modes may, for example, result in a greater quantity of MR4 bits being transmitted. The host device 305 may transmit an AREF command to the memory device 310 at a periodicity based on the predefined refresh rate communicated by the MR4 bits. In some examples, the mode register 325 may communicate the tREFI to the host device 305 (e.g., via one or more sideband connections).

In some examples, the host device 305 may enable a TCR mode at the memory device 310 based on communicating with the mode register 325. An initial communication between the mode register 325 and the host device 305 may result in one or more AREF commands being transmitted to the memory device 310 at a predefined refresh rate (e.g., a tREFI) based on the temperature of the memory device 310. In some examples, the mode register 325 may periodically communicate with the host device 305 to update the predefined refresh rate based on one or more updated parameters of the memory device 310 (e.g., based on an updated temperature of the memory device 310). Stated another way, the host device 305 may be configured to periodically update the tREFI of the AREF commands provided to the memory device 310.

In some refresh operations, the host device 305 may be configured to periodically postpone or skip transmitting an AREF command due to the temperature of the memory device 310. Stated another way, the tREFI of the AREF commands provided to the memory device 310 may be determined based on a step function (e.g., as described with reference to FIG. 5), where ranges of temperatures are associated with a same tREFI value. Hotter memory dies (e.g., high operating temperature) may involve refresh operations at a higher frequency to preserve data integrity and cooler memory dies (e.g., a lower operating temperature) may involve fewer refresh operations relative to the higher operating temperature. Thus, in some refresh operations, the host device 305 may periodically postpone transmitting an AREF command if the temperature of the memory device 310 falls below a particular point within a range of temperatures. Although periodically skipping an AREF command may temporarily reduce the power consumption of the memory device, skipping one or more AREF commands may not reduce the overall peak power consumption associated with a single refresh operation.

In the examples described herein, memory device 310 may operate in a TCR mode (e.g., based on receiving a command from the host device 305 or based on an internal command). Operating in the TCR mode may allow the memory device 305 to use the AREF commands transmitted by the host device 305 at the predefined rate (e.g., at tREFI) in a particular manner. In order to operate in the TCR mode, one or more fuses and/or antifuse associated with the memory device 310 may enabled or disabled. By operating in the TCR mode, the memory device 310 may be configured to internally postpone or skip one or more portions (e.g., one or more pumps) of a refresh operation based on its temperature, thus reducing the power consumption of the memory device 310 at a given time (e.g., the instantaneous power consumption of the memory device 310).

The host device 305 may enable a TCR mode by transmitting a command (e.g., a command to enable an on-die TCR) to the memory device 310. When a TCR mode is enabled, the memory device 310 may perform one or more operation in response to receiving one or more AREF commands from the host device 305. In some examples, an AREF command may be associated with a single refresh operation, and the host device 305 may transmit more than one AREF command (e.g., a plurality of AREF commands) to the memory device 310 based on the tREFI value. Stated another way, the tREFI may indicate a periodicity at which the host device 305 transmits AREF commands to the memory device 310 in order to refresh each of the rows of the memory array 345. In some examples, the host device 305 may transmit AREF commands to the memory device 310 with a same periodicity until an updated tREFI is received (or until the host device 305 receives an indication to modify or cease the refresh operation).

Each refresh operation may be associated with multiple portions (e.g., multiple pumps) that may each be associated with refreshing a subset of memory cells of the memory array 345 (e.g., rows of the memory array 345). In some examples, each portion (e.g., each pump) may be referred to as an event. Thus, a single refresh command may include or may be associated with a plurality of events. For example, an AREF command may be associated with six events (e.g., six pumps) and may be transmitted to the memory device 310 based on the tREFI. In some examples, each event of the AREF command may be configured to refresh a different memory cell or a different row of memory cells of the memory array 345. In some examples, the command decoder 320 may decode the AREF command received from the host device 305, and may transmit information associated with the command (e.g., which memory cell or memory cells to refresh) to the refresh control component 340.

When the memory device 310 is operating in a TCR mode, the temperature component 330 may periodically determine the temperature of the memory device 310, which may be utilized in postponing one or more events of the refresh operation (e.g., skipping one or more pumps). In some examples, the temperature may be provided to the mode register 325, which may communicate with the host device 305 an updated tREFI. In other examples, the temperature may be provided directly to the refresh logic component 335 (or to the refresh logic component 335 via the mode register 325) for use in postponing one or more events of the refresh operation. Thus, in some examples, the temperature component 330 may periodically determine the temperature of the memory device 310 and may transmit the temperature (e.g., transmit an indication of the temperature) to the refresh logic component 335. In other examples, the temperature component 330 may continuously determine the temperature of the memory device 310 in real-time.

In some examples, the refresh logic component 335 may determine a rate for postponing and/or skipping one or more events of the refresh operation based on a variety of inputs. As shown in FIG. 3, the refresh logic component 335 may receive a temperature of the memory device 310 (e.g., an indication of the temperature of the memory device 310) from the temperature component 330. The refresh logic component 335 may communicate with the mode register 325 and/or the refresh control component 340 to receive an indication of the tREFI (e.g., via the MR4 bits). For example, the mode register 325 may transmit an indication of the tREFI to the refresh logic component 335 based on the initial determination of the temperature of the memory device 310 as described above. In other examples, the refresh logic component 335 may receive an indication of the tREFI from the refresh control component 340 or the command decoder 320 (not shown) based on the frequency of AREF commands received from the host device 305.

In order to determine the rate for postponing and/or skipping one or more events of the refresh operation, the refresh logic component 335 may receive an input from the refresh control component 340 that indicates a tuning parameter. The tuning parameter may comprise one or more bits, and may be or may include TM bits. The TM bits may indicate, to the refresh logic component 335, a desired power savings associated with postponing one or more events of the refresh operation (e.g., one or more portions of the AREF command). Stated another way, the memory device 310 may be configured to postpone and/or skip various combinations of pumps of any one refresh operation without compromising the integrity of the associated data. Postponing and/or skipping more pumps may, for example, result in a greater power savings (e.g., a greater instantaneous and/or peak power savings and a greater overall power savings). The exact quantity of pumps postponed and/or skipped, and the desired peak power savings indicated by the TM bits may be a matter of design choice selected prior to packaging the memory device 310. For example, the refresh logic component 335 may receive an input line (not shown) for receiving the TM bits. The particular TM bits received may, in some examples, dictate a quantity of pumps of an AREF command to postpone and/or skip. Because greater instantaneous power savings may be desirable in some instances, the TM bits may indicate a relatively greater quantity of pumps of an AREF command to skip (e.g., based on the temperature of the memory device 310). The TM bits are discussed in detail with reference to FIG. 5.

In some examples, postponing or skipping one or more pumps may increase a duration associated with executing a refresh command. Stated another way, the amount of time it takes to refresh an entire memory die or memory array may be slowed by postponing one or more pumps. A pump may be postponed, for example, by refraining from refreshing a row of memory cells (or rows of memory cells) associated with the pump. For example, an AREF command may be associated with six pumps and the entire command may take approximately 324 ns to execute (e.g., it may take 324 ns refresh the associated memory cells). In some examples, each pump of the six may take approximately 54 ns to execute (e.g., totaling 324 ns overall). When the AREF command is executed, each of the pumps may be executed (e.g., pump-pump-pump-pump-pump-pump). However, by postponing one or more pumps, an intentional delay may be introduced by the memory device 310. For example, postponing the second pump may result in the AREF command being executed as pump-postpone-pump-pump-pump-pump-pump. Thus each pump may be executed (e.g., each of the memory cells associated with the refresh command may be refreshed) but the overall refresh command may take longer to execute. In some examples, the postponed pump may be executed in a subsequent AREF command, which may effectively increase tREFI.

In another example, skipping one or more pumps may increase a duration associated with refreshing a particular row or rows of memory cells. Stated another way, the amount of time it takes to refresh an entire memory die or memory array may be slowed by skipping one or more pumps. A pump may be skipped, for example, by refraining from refreshing a row of memory cells during a refresh command (and refreshing the row during a subsequent AREF command). For example, an AREF command may be associated with six pumps and, when executed, each of the pumps may be executed (e.g., pump-pump-pump-pump-pump-pump). However, by skipping one or more pumps, one or more rows of memory cells may not be refreshed. For example, skipping the second pump may result in the AREF command being executed as pump-skip-pump-pump-pump-pump. Thus five of the six pumps may be executed. Subsequently, the host device 305 may issue an AREF command configured to refresh the row of memory cells associated with the skipped pump. In some examples, the memory device 310 may be configured to refresh the row of memory cells associated with the skipped pump independent from the host device 305. Thus by skipping one or more pumps, the rate at which a particular row or rows of memory cells may be slowed.

In yet another example, a pump may be associated with a quantity of word lines (e.g., a word line 210 as described with reference to FIG. 2). When a refresh operation is executed using a particular pump, a corresponding word line (or group of word lines) may be activated, thus refreshing each of the associated memory cells. For example, a pump may be associated with eight word lines. Thus, executing an AREF command associated with six pumps may result in 48 word lines being activated. By postponing one or more pumps, fewer word lines may be activated per AREF command. For example, postponing the second pump may result in the AREF command being executed as pump-postpone-pump-pump-pump-pump-pump, which may result in 40 word lines being activated (e.g., 8-0-8-8-8-8). In some examples, a number of word lines associated with each pump may be reduced. For example, each pump may be configured to activate four word lines. Thus, a single AREF command, when executed, may activate 24 word lines, which may result in a decreased peak power consumption and decreased overall power consumption of the memory device 310.

In some examples, the refresh logic component 335 may perform an interpolation operation based on the received input. For example, the refresh logic component 335 may construct various new data points based on the temperature of the memory device 310, the MR4 bits (e.g., an indication of the tREFI) received from the mode register 325, and/or the TM bits (e.g., a tuning parameter). The new data points constructed based on the interpolation operation may indicate a desired refresh rate based on the temperature of the memory device 310. As described herein, in a refresh operation, the tREFI may be selected based on a range of temperatures of the memory device. For example, AREF commands may be issued to the memory device 310 at a same rate if the temperature of the memory device 310 ranges between 0 C and 36 C. However, the interpolation operation performed by the refresh logic component 335 may determine new data points that may allow for fine-tuning the rate at which AREF commands are executed by the memory device 310 if the temperature of the memory device 310 falls within a certain range (e.g., between 0 C and 36 C). In some examples, the new data points may indicate the rate for postponing and/or skipping one or more events of the refresh operation. Stated another way, one or more pumps of a refresh operation (e.g., of an AREF command) may be postponed and/or skipped based on the interpolation operation performed by the refresh logic component 335.

The refresh logic component 335 may determine a postpone parameter or skip parameter based on the received input. For example, the refresh logic component 335 may determine a postpone parameter or skip parameter based on the temperature of the memory device 310, the MR4 bits (e.g., an indication of the tREFI) received from the mode register 325, and/or the TM bits (e.g., a tuning parameter). In some cases, the refresh logic component 335 may determine a postpone parameter and/or skip parameter based on performing the interpolation operation. In some examples, the parameter may indicate one or more pumps of a refresh operation to postpone and/or skip and may be transmitted to the refresh control component 340. As described herein, the refresh control component 340 may receive (e.g., from the host device and/or the command decoder 320) one or more AREF commands at a predefined rate (e.g., based on tREFI). Thus, based on receiving the postpone parameter or the skip parameter and an AREF command, the refresh control component 340 may selectively execute each AREF command. Stated another way, the refresh control component 340 may postpone and/or skip one or more pumps of each AREF command.

For example, an AREF command may be associated with six events (e.g., six pumps) and the parameter may indicate that two events are to be postponed. Thus, the refresh control component 340 may postpone two pumps (e.g., insert a delay associated with the timing needed to execute pumps) of the AREF command when conducting a refresh operation on the memory array 345. The refresh logic component 335 and/or the refresh control component 340 may determine which particular pumps are to be postponed and/or skipped and, in some examples, may skip and entire refresh command (e.g., the refresh logic component 335 and/or the refresh control component 340 may determine to skip an entire AREF command). The determination may be based on one or more operating parameters of the memory device 310 (e.g., based on the operating temperature of the memory device 310).

In some examples, the refresh control component 340 may receive AREF commands at a periodicity based on the MR4 bits transmitted to the host device 305 (e.g., based on the tREFI). Each time the refresh control component 340 receives an AREF command, the temperature component 330 may be configured to determine a temperature of the memory device 310 and the refresh logic component 335 may be configured to perform an interpolation operation. Thus, in some examples, the refresh control component 340 may postpone and/or skip one or more pumps of an AREF command transmitted to the memory array 345 based on the current operating temperature of the memory device 310. In other examples, the temperature component 330 and the refresh logic component 335 may be configured to perform their respective operations at a predefined time.

In some examples, the refresh logic component 335 may transmit both the postpone parameter and/or skip parameter and the TM bits (e.g., the tuning parameter) to the refresh control component 340. By transmitting the postpone parameter and/or the skip parameter and the TM bits, the refresh control component 340 may conduct a different type of operation (e.g., a different type of memory access operation) when one or more pumps are postponed and/or skipped. For example, the refresh control component 340 may perform a row hammer refresh (RHR) command. During ordinary operations, specific rows of the memory array 345 may be targets of repeated access. When a row is accessed repeatedly within a particular time, a physically adjacent row may experience data corruption (or be susceptible to data corruption). This may be or may be referred to as a row hammer event, and may be corrected via a targeted refresh operation (e.g., by intentionally refreshing the repeatedly accessed row and/or the physically adjacent rows). Accordingly, in some examples, the memory device 310 may be configured to perform a RHR operation during a duration when one or more pumps of an AREF command are skipped.

Additionally or alternatively, the operations described herein (e.g., skipping one or more pumps of an AREF command) may be performed on a per-die basis. For example, the memory device 310 may be an example of one memory die in a stack of memory dies. Each memory die may include a same set of components as the memory device 310. Or, in some examples, one or more of the components as described and illustrated with reference to FIG. 3 may be shared by one or more dies. For example, the temperature component 330 may be configured to determine the temperature of each memory die in a stack of memory dies.

By performing the operations on a per-die basis, the postponing and/or skipping of pump events across the dies may be staggered. This may reduce the overall power consumption and peak power consumption of the stack. For example, a stack of four memory dies may receive four AREF commands—a first AREF command for the first memory die, a second AREF command for the second memory die, a third AREF command for the third memory die, and a fourth AREF command for the fourth memory die. Each AREF command may be received sequentially such that no two dies receive an AREF command at the same time. In some examples, the memory device 310 may be configured to postpone and/or skip one or more pumps of each AREF command. Stated another way, the memory device (via the operations described herein) may be configured to postpone and/or skip at least one pump of the first AREF command, at least one pump of the second AREF command, at least one pump of the third AREF command, and at least one pump of the fourth AREF command. Additionally or alternatively, the stack of four memory dies may receive a single AREF command, and each memory die may be configured to skip a respective (e.g., a different) pump. Accordingly, the overall power consumption and peak power consumption associated with each AREF command may be reduced, thus reducing the overall power consumption of the memory device 310.

FIG. 4 illustrates an example of a system 400 that supports refresh command management as disclosed herein. The system 400 may implement aspects of the system 100 and memory array 200 as described with reference to FIGS. 1 and 2. The system 400 may include a host device 405, which may implement aspects of an memory controller 105 as described with reference to FIG. 1. The system 400 may further include a memory device 410, which may be an example of a memory device 110 or the memory array 200 as described with reference to FIGS. 1 and 2. One or more components of the memory device 410 may be included in, for example, the refresh logic component 335 as described with reference to FIG. 3. In some examples, the memory device 410 may be an example of a memory die or may be referred to as a memory die.

The memory device 410 may support refresh command management and thus may be configured to internally adjust a refresh rate of one or more memory cells of the memory array 435. In some examples, the memory device 410 may include an AREF counter 415, a SREF counter 425, and a refresh logic component 430. In some examples, the memory device 410 may include a signal generator 420, which may include or may be in communication with a temperature component (e.g., a temperature component 330 as described with reference to FIG. 3) and/or a rate table (not shown). In some examples, the rate table may be an example of a lookup table or may be referred to as a lookup table.

In order to internally adjust the refresh rate of one or more memory cells of the memory array 435 (e.g., in order to postpone one or more events of a refresh command), the memory device 410 may compare refresh commands received from the host device 405 to self-refresh commands generated by the memory device 410. The memory device 410 may receive a command from the host device 405. The command may be or may be referred to as a refresh command (e.g., an AREF command) and may be received via one or more memory pins of the memory device 410. In some examples, the AREF command may be received when the memory device 410 is in an TCR mode. In some examples, during the TCR mode, one or more AREF commands may be received at a predefined refresh rate (e.g., tREFI). In some examples, the predefined refresh rate (e.g., the rate at which AREF commands are transmitted from the host device 405 to the memory device 410) may be transmitted to the host device 405 based on a command received from a mode register (e.g., a mode register 325 as described with reference to FIG. 3).

In some examples, the memory device 410 may conduct a self-refresh operation (e.g., an SREF operation). In some examples, a self-refresh operation may allow for the memory device 410 to conduct a refresh operation independent from the host device 405. Each self-refresh operation may be associated with one or more events (e.g., one or more pumps), which may allow the operation to be conducted with a greater frequency or a lesser frequency than, for example, the refresh operation associated with the AREF command. The SREF operation may increase or decrease in frequency based in part on a quantity of pumps that are skipped and/or postponed, which may be based on the operating temperature of the memory device 410.

The mode register may communicate, to the host device 405, the temperature of the memory device 410 and/or the predefined refresh rate (e.g., tREFI) based on the temperature of the memory device 410. Stated another way, in some examples the predefined refresh rate may be determined by the memory device 410 (e.g., by the mode register) and may be communicated to the host device 405, and in other examples the predefined refresh rate may be determined by the host device 405 (e.g., based on receiving the temperature of the memory device from the mode register).

The host device 405 may enable a TCR mode by transmitting a command to the memory device 410 or, in some examples, the TCR mode may be enabled by one or more internal commands (e.g., internal to the memory device 410). In some examples, during a TCR mode, the memory device may receive one or more AREF commands, which may be associated with a single refresh operation. In some examples, the host device 405 may transmit more than one AREF commands (e.g., a plurality of AREF commands) to the memory device 410 based on the tREFI value. Stated another way, the tREFI may indicate a periodicity at which the host device 405 transmits AREF commands to the memory device 410. In some examples, the host device 405 may continually transmit AREF commands to the memory device 410 with a same periodicity until an updated temperature of the memory device 410 is provided to the host device 405 (or until the host device 305 receives an indication to cease the refresh operation).

As described herein, each refresh operation may be associated with multiple portions (e.g., pumps) that may each be associated with refreshing a subset of memory cells of the memory array 435. For example, an AREF command may include six events (e.g., six pumps) and may be transmitted to the memory device 410 based on the tREFI. In some examples, each event of the AREF command may be configured to refresh a different memory cell or a different row of memory cells of the memory array 435. In some examples, the AREF commands may be transmitted from the host device 405 to the refresh logic component 430 via the memory pins 440. Concurrently, the AREF counter 415 may be incremented (e.g., based on an indication received from the refresh logic component 430). Thus, each time the memory device 410 receives an AREF command, the AREF counter 415 may be increased to indicate a total quantity of external refresh commands received by the memory device 410.

In some examples, the signal generator 420 may be associated with a self-refresh operation (e.g., an SREF operation) of the memory device 410. In some examples, a self-refresh operation may allow for the memory device 410 to conduct a refresh operation independent from the host device 405. For example, the memory device 410 may be able to conduct a refresh operation with a greater frequency or a lesser frequency than, for example, the refresh operation associated with the AREF command. The SREF operation may increase or decrease in frequency based in part on the operating temperature of the memory device 410.

The signal generator 420 may be or may include a clock configured to generate one or more clock signals. Additionally or alternatively, the signal generator 420 may be in communication with a temperature component (e.g., a temperature component 330 as described with reference to FIG. 3) and/or a rate table (not shown). The temperature component may be configured to determine an operating temperature of the memory device 410 and, based on its temperature, determine a refresh rate for one or more memory cells of the memory array 435 based on the rate table. For example, as the memory device 410 increases in temperature, the rate table may indicate that a SREF operation should increase in frequency. Conversely, as the memory device 410 decreases in temperature, the rate table may indicate that the SREF operation should decrease in frequency. The rate (e.g., the frequency) at which a refresh operation is issued (e.g., based on the rate table) may be based on the clock signal generated by the signal generator 420.

In some examples, the signal generator 420 and SREF counter 425 may be used for postponing and/or skipping one or more events (e.g., pumps) of the AREF command received from the host device 405. For example, each time that an SREF command is issued by the signal generator 420 (e.g., based on the temperature of the memory device 410), the SREF counter 425 may be incremented. Thus, each time the memory device 410 issues an SREF command, the SREF counter 425 may be increased to indicate a total quantity of internal refresh commands generated by the memory device 410.

In order to determine whether one or more pumps of the AREF command should be postponed and/or skipped, the count of the AREF counter 415 and the count of the SREF counter 425 over some duration may be compared (e.g., by the refresh logic component 430). In some examples, the rate at which AREF commands are issued to the memory device 410 may be standardized (e.g., based on a predefined operating parameter). Because the memory device 410 may issue SREF commands at a rate that is directly associated with the operating temperature of the memory device 410, the rate at which internal SREF commands (e.g., clocking events) are issued may more-accurately identify the optimal refresh rate for the memory array 435. Stated another way, when a count of the SREF counter 425 exceeds a count of the AREF counter 415 (e.g., when more internal SREF clocking events than AREF commands have occurred), the AREF commands may not be postponed or skipped by the refresh logic component 430. Conversely, when a count of the AREF counter 415 exceeds a count of the SREF counter 425 by a predefined amount (e.g., when more AREF commands have been issued to the memory device 410 than SREF clocking events have occurred), the refresh logic component 430 may determine to skip one or more AREF commands (e.g., one or more pumps). Stated another way, when a count of AREF commands exceeds a count of SREF clocking events, the memory device 410 may decrease the rate at which the memory array 435 is refreshed without harming the integrity of its data.

As described herein, the refresh logic component 430 may be configured to postpone and/or skip one or more pumps of the AREF command based on a count of the AREF counter 415 exceeding a count of the SREF counter 425. The exact quantity of pumps postponed and/or skipped may be based on the exact counts of the counters. For example, the quantity of pumps of the AREF command that the refresh logic component 430 skips may be proportional to a quantity of counts by which the SREF counter 425 exceeds the AREF counter 415. In other examples, the refresh logic component 430 may utilize a lookup table (or a similar method) to determine the exact quantity of pumps of AREF commands that may be postponed and/or skipped based on a count of the AREF counter 415 exceeding a count of the SREF counter 425.

After comparing the count of the respective counters, the refresh logic component 430 may transmit a command (e.g., an internal command) to the memory array 435. The internal command may be configured to conduct a refresh operation on one or more memory cells of the memory array 435, and may include one or more postponed and/or skipped events (e.g., pumps). In some examples, after a predetermined time or event (e.g., after an internal command is transmitted to the memory array 435), the AREF counter 415 and the SREF counter 425 may be reset. By resetting the counters, the duration that the refresh logic component 430 monitors the counts may be minimized.

In some examples, during a duration that one or more pumps are postponed and/or skipped, the refresh logic component 430 may conduct a different type of operation (e.g., a different type of memory access operation) on the memory array 435. For example, the refresh logic component 430 may perform a RHR command on one or more rows of memory cells.

Additionally or alternatively, the operations described herein (e.g., skipping one or more pumps of an AREF command) may be performed on a per-die basis. For example, the memory device 410 may be an example of one memory die in a stack of memory dies. Each memory die may include a same set of components as the memory device 410. Or, in some examples, one or more of the components as described and illustrated with reference to FIG. 4 may be shared by one or more dies. For example, the refresh logic component 430 may be configured to compare the count of an AREF counter and an SREF counter in each memory die in a stack of memory dies, and transmit an internal command to each respective memory array.

By performing the operations on a per-die basis, the postponing and/or skipping of pump events across the dies may be staggered. This may reduce the overall peak power consumption of the stack. For example, a stack of four memory dies may receive four AREF commands—a first AREF command for the first memory die, a second AREF command for the second memory die, a third AREF command for the third memory die, and a fourth AREF command for the fourth memory die. Each AREF command may be received in parallel by two or more dice. In some examples, the memory device 410 may be configured to postpone and/or skip one or more pumps of each AREF command by issuing a respective internal command (e.g., to the memory array of each memory die). Stated another way, the memory device 410 (via the operations described herein) may be configured to postpone and/or skip at least one pump of the first AREF command, at least one pump of the second AREF command, at least one pump of the third AREF command, and at least one pump of the fourth AREF command based on a temperature of each memory die. Accordingly, the peak power consumption of each AREF command issued to each respective memory die may be reduced, thus reducing the overall peak power consumption of the memory device 410.

Figure 5:
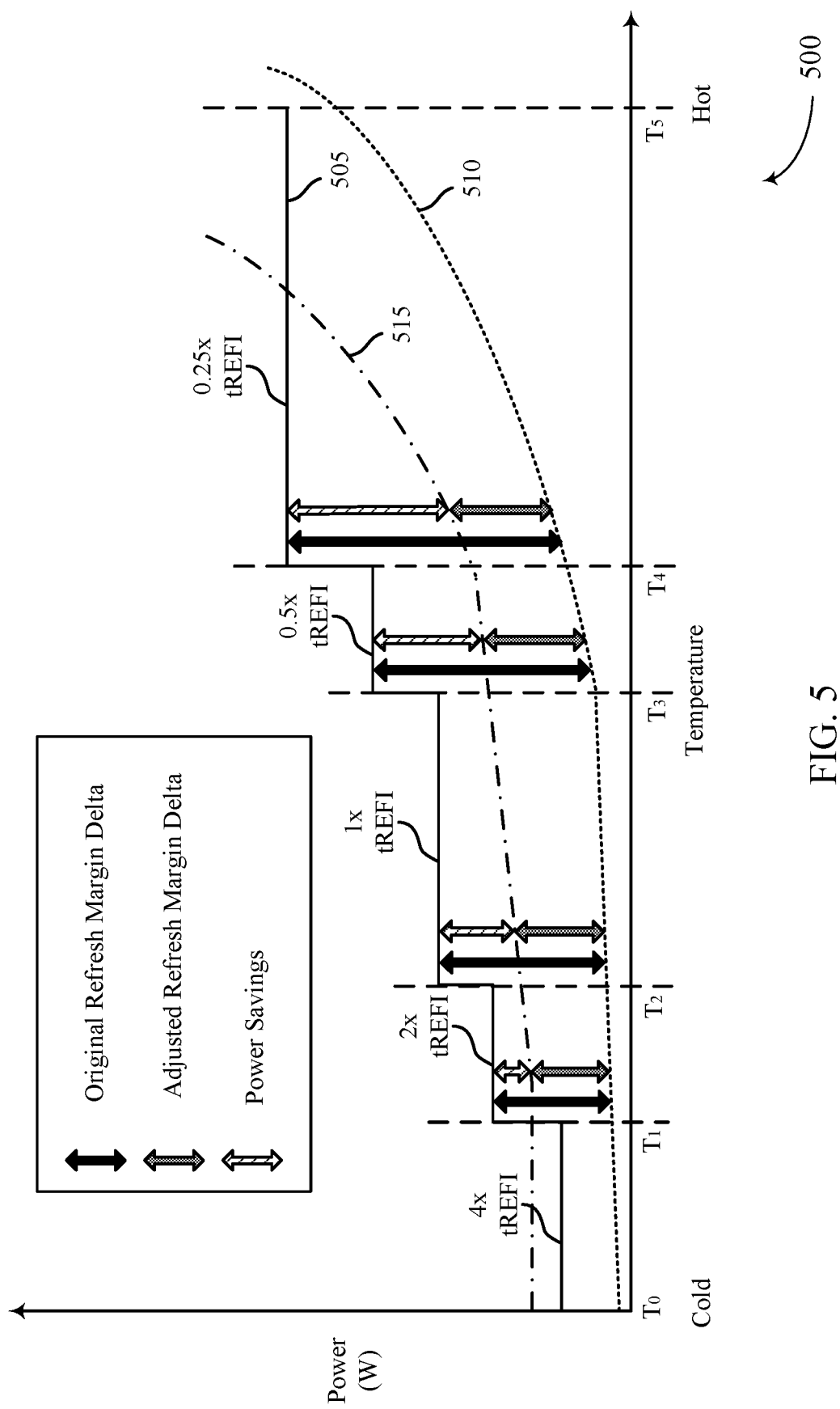
FIG. 5 illustrates an example of a temperature diagram that supports refresh command management as disclosed herein.

FIG. 5 illustrates an example of a temperature diagram 500 that supports refresh command management as disclosed herein. The temperature diagram 500 may illustrate operational aspects of the system 300 and/or the system 400. For example, the temperature diagram 500 may depict a refresh rate 515 of a memory device where one or more events of an AREF command have been postponed and/or skipped. The refresh rate 515 may be result from one or more operations as described with reference to FIGS. 3 and 4. Additionally, the temperature diagram 500 may depict a refresh rate 505 of a memory device without postponing and/or skipping any events (e.g., pumps) of a command (e.g., of an AREF command), and a refresh rate 510 needed to preserve the integrity of data stored to a memory device (e.g., to prevent data corruption). In some examples, the rate (e.g., the refresh rate) at which AREF commands are transmitted to a memory device may increase as the temperature of the memory device increases. Stated another way, the temperature diagram 500 may depict an increase in a temperature of a memory device along the X-axis and an increase in the resulting power consumption along the Y-axis. Thus, a memory device having a higher temperature may be required to be refreshed more frequently and may consume more power.

In some examples, the refresh rate 510 may depict the refresh rate needed by a memory device (e.g., at a particular temperature) in order to maintain the integrity of its data. If the memory device is refreshed at a rate below the refresh rate 510, errors may be introduced into the stored data. As described herein, the need for a refresh operation may be a function of a memory device's temperature. Stated another way, the temperature of a memory die may be used to determine a rate at which the device's memory cells need to be refreshed—e.g., the hotter the temperature of the die, the more frequent that refresh operations are conducted and vice versa. Thus it may be beneficial for a refresh operation to utilize a refresh rate greater than the refresh rate 510 in order to maintain the integrity of the associated memory device's data.

In some examples, the refresh rate 505 may depict the refresh rate of a refresh operation (e.g., a refresh operation without postponing and/or skipping any pumps of an AREF command). As the temperature of the memory device increases, the refresh rate 505 may increase at a first rate (e.g., it may increase as a step function). Stated another way, as the temperature of the memory device increases, the time between consecutive refresh operations may decrease. For example, if the temperature of the memory device resides between $T_0$ and $T_1$, then one or more AREF commands may be issued to the associated memory device at a first refresh rate (e.g., at 4×tREFI). Similarly, if the temperature of the memory device resides between $T_2$ and $T_3$, then one or more AREF commands may be issued to the associated memory device at a higher refresh rate (e.g., at 1×tREFI). Thus a memory device residing at a temperature between $T_0$ and $T_1$ (e.g., at 4×tREFI) may receive consecutive refresh operations less-periodically than if the memory device resides at a temperature between $T_2$ and $T_3$. Accordingly, for each temperature range (e.g., between $T_0$ and $T_1$, between $T_1$ and $T_2$, etc.) one or more AREF commands may be issued to an associated memory device at an increased rate relative to the prior temperature range.

In some examples, receiving AREF commands at a same rate for an entire temperature range may lead to increased power consumption by the associated memory device. For example, a memory array having a temperature slightly greater than $T_1$ may not need to be refreshed at the same frequency than if its temperature was slightly less than $T_2$. However, because both temperatures reside between $T_1$ and $T_2$, the memory array may receive AREF commands at a same rate (e.g., at 2×tREFI) at both temperatures during a refresh operation. This increased power consumption may be depicted in FIG. 5 as the original refresh margin delta. The original refresh margin delta may refer to the difference between the refresh rate 505 and the refresh rate 510 needed to maintain integrity of the device's data.

As the distance between the refresh rate 505 and the refresh rate 510 increases, the more power an associated memory device may consume relative to the base refresh rate 510. In some examples, an increase in the original refresh margin delta may be associated with utilizing a same refresh rate for an entire temperature range. Additionally or alternatively, although a refresh operation may support skipping one or more AREF commands in its entirety, skipping one or more AREF commands may not reduce the peak power consumption of the memory array. However, as described herein, skipping one or more events (e.g., pumps) of an AREF command (e.g., at the memory device) may reduce the net power consumption of the associated memory device.

In some examples, the refresh rate 515 may depict the refresh rate of a refresh operation as described with reference to FIGS. 3 and 4. For example, the refresh rate may represent one or more postpone parameters and/or skip parameters transmitted from a refresh logic component (e.g., the refresh logic component 335 as described with reference to FIG. 3) to a refresh control component (e.g., the refresh control component 340 as described with reference to FIG. 3). The refresh control component may, for example, postpone and/or skip one or more pumps of a refresh operation (e.g., of an AREF command). As the temperature of the memory device increases, the rate at which it is refreshed may also increase. However, by postponing and/or skipping one or more pumps of the refresh operation, the refresh rate 515 may be reduced relative to the refresh rate 505 while being above the refresh rate 510 needed to maintain integrity of the device's data.

In some examples, as described herein, the refresh logic component may receive one or more bits (e.g., TM bits) that indicate a desired peak power savings. Stated another way, as a matter of design choice, the refresh rate 515 may be adjusted relative to the refresh rate 505 and/or the refresh rate 510 to increase or decrease the power savings of the memory device. Thus the refresh rate 515 may be adjusted to postpone and/or skip various combinations of pumps of any one refresh operation without compromising the integrity of the associated data (e.g., without dropping below refresh rate 510). In some examples (not shown), the refresh rate 515 may be positioned in other locations relative to the refresh rate 505 and/or the refresh rate 510. For example, any portion of the refresh rate 505 may be located above the refresh rate 515, any portion of the refresh rate 505 may bisect the refresh rate 515, and/or any portion of the refresh rate 505 may be located just above the refresh rate 510. In some examples, the location of the refresh rate 505 may be based on a self-refresh rate of a memory device as described with reference to FIG. 4.

In another example, the refresh rate 515 may represent one or more parameters for postponing or skipping refresh events transmitted from a refresh logic component (e.g., the refresh logic component 430 as described with reference to FIG. 4) based on the count of one or more counters (e.g., based on the count of AREF counter 415 and the count of SREF counter 425 as described with reference to FIG. 4). The refresh logic component 430 may, for example, postpone and/or skip one or more pumps of a refresh operation (e.g., of an external AREF command), which may result in a reduced refresh rate relative to a refresh operation (e.g., relative to refresh rate 505), yet above the refresh rate 510 needed to maintain integrity of the device's data.

In some examples, postponing and/or skipping one or more pumps of an AREF command based on the temperature of the memory device may result in a decrease in overall power consumption by the associated memory device, as well as an average reduction in instantaneous power consumption across the temperature range. For example, as described herein, a memory array having a temperature slightly greater than $T_1$ may not need to be refreshed as frequently than if its temperature was slightly less than $T_2$ (e.g., in order to maintain the integrity of its data). By performing one or more of the operations as described above with reference to FIGS. 3 and 4, the memory array may postpone and/or skip one or more pumps of an AREF command based on the temperature of the memory device. This decreased power consumption may be depicted in FIG. 5 as the power savings delta (e.g., the difference between the refresh rate 505 and the refresh rate 515). The power savings delta may refer to the difference between the stepped refresh rate and the refresh rate 515 needed to maintain integrity of the device's data. The adjusted refresh margin delta may refer to the difference between the refresh rate 515 and the refresh rate 510 needed to maintain integrity of the device's data.

As the distance between the refresh rate 515 and the refresh rate 510 decreases, the less power an associated memory device may consume. Stated another way, as the distance between the refresh rate 505 and the refresh rate 515 increases, the greater power savings due to postponing and/or skipping one or more pumps of a refresh operation. Additionally or alternatively, postponing and/or skipping one or more pumps of an AREF command may reduce the overall average power consumption of the memory array. For example, a single AREF command may include six pumps and may consume 1.2 W (e.g., 0.2 W/pump). By skipping the entire AREF command (e.g., as described with reference to the refresh rate 505), the memory device may experience a 1.2 W savings. However, when the refresh operation is conducted, the memory device may still consume the entire 1.2 W (e.g., its peak power consumption). However, by postponing and/or skipping one or more pumps in addition to skipping an entire AREF command may reduce both the peak power consumption of the memory device as well as its overall power consumption. For example, when an entire AREF command is not skipped, skipping a single pump may reduce the power consumption by one sixth (e.g., from 1.2 W to 1.0 W). By reducing the peak power consumption of the memory device as well as its overall power consumption, occurrences of data loss, data corruption, and, system failure may be mitigated.

The table below (e.g., Table 1) may illustrate examples of skipping one or more AREF commands, postponing one or more pumps of an AREF command, and/or skipping one or more pumps of an AREF command. Each refresh command may include a group of pumps that are configured to refresh a respective row of memory cells. For example, a first refresh command without any postponing or skipping may include five pumps that are each configured to refresh a respective row of memory cells (e.g., R1, R2, R3, R4, and R5). The examples as described below may be examples of features performed by the system 300 as described with reference to FIG. 3 and/or the system 400 as described with reference to FIG. 4.

TABLE 1

| Scenario/Case | First Refresh Command | Second Refresh Command | Third Refresh Command |
|---|---|---|---|
| Refresh with no postponing or skipping | R1 R2 R3 R4 R5 | R6 R7 R8 R9 R10 | R11 R12 R13 R14 R15 |
| Refresh with 1/2 command postpone rate | Postpone all pumps | R1 R2 R3 R4 R5 | Postpone all pumps |
| Refresh with 2/5 pump postpone rate | R1 XX R2 XX R3 | R4 XX R5 XX R6 | R7 XX R8 XX R9 |
| Refresh with 2/5 pump skip rate | R1 XX R3 XX R5 | R6 XX R8 XX R10 | R11 XX R13 XX R15 |

A refresh command (e.g., an AREF command) may be associated with multiple pumps (e.g., refresh events performed by the memory device) configured to refresh a subset of a memory array. For example, each pump may be configured to refresh a respective row. As shown in the table above, each refresh command (e.g., the first, second, and third refresh commands) may each include five pumps configured to refresh five respective rows of memory cells. In some examples, a first refresh command without any postponing or skipping may refresh all five rows (e.g., R1, R2, R3, R4, and R5). Subsequently, a second refresh command may refresh the next five rows (e.g., R6, R7, R8, R9, and R10), and the third refresh command may refresh the final five rows of the hypothetical memory array (e.g., R11, R12, R13, R14, and R15).

In some examples, the refresh with ½ command postpone rate may illustrate one or more refresh commands (e.g., AREF commands) being postponed in their entirety. As described herein, a memory device may be configured to postpone a command in its entirety based on its operating parameters. By skipping one or more commands in their entirety, the memory device may experience an overall power savings. In some examples, a first refresh command with ½ command postpone rate may postpone a first refresh command in its entirety, for example, based on one or more operating parameters of the memory device. Subsequently, a second refresh command may refresh the first five rows (e.g., R1, R2, R3, R4, and R5), and the third refresh command may be postponed (e.g., again due to one or more operating parameters of the memory device). In some examples, rows R6-R15 may still be refreshed, but at a later time and may be based on subsequent refresh commands (e.g., a fourth refresh command, which is not shown).

In some examples, the refresh with ⅖ pump postpone rate may illustrate one or more pumps of a refresh command (e.g., of an AREF command) being postponed. As described herein, a memory device may be configured to postpone one or more pumps of a refresh command based on the operating parameters of the memory device. By postponing one or more pumps, the memory device may experience a reduction in peak power consumption as well as an overall power savings. In some examples, a first refresh command with ⅖ pump postpone rate may postpone two pumps (e.g., R1 XX R2 XX R3) based on one or more operating parameters of the memory device. Subsequently, a second refresh command may postpone two pumps (e.g., R4 XX R5 XX R6), and the third refresh command may also postpone two pumps (e.g., R7 XX R8 XX R9). In some examples, rows R10-R15 may still be refreshed, but at a later time and may be based on subsequent refresh commands (e.g., a fourth refresh command, which is not shown).

Additionally or alternatively, one or more pumps of a refresh command may be postponed by altering the structure of the refresh commands that are depicted in the table. For example, the first refresh command with ⅖ pump postpone rate may postpone two pumps by issuing a command structured as R1, XX, R2, XX, R3, R4, R5. Subsequently, the second and third refresh commands may be structured as R6, XX, R7, XX, R8, R9, R10 and R11, XX, R12, XX, R13, R14, R15, respectively. By structuring the commands as such, each row of memory cells of the memory array may be refreshed by utilizing refresh commands that take longer to execute (e.g., based on the operating parameters of the memory device).

In some examples, the refresh with ⅖ pump skip rate may illustrate one or more pumps of a refresh command (e.g., of an AREF command) being skipped. As described herein, a memory device may be configured to skip one or more pumps of a refresh command based on the operating parameters of the memory device. By skipping one or more pumps, the memory device may experience a reduction in peak and/or instantaneous power consumption as well as an overall power savings. In some examples, a first refresh command with ⅖ pump skip rate may skip two pumps (e.g., R1 XX R3 XX R5) based on one or more operating parameters of the memory device. Subsequently, a second refresh command may skip two pumps (e.g., R6 XX R8 XX R10), and the third refresh command may also skip two pumps (e.g., R11 XX R13 XX R15). In some examples, rows R2, R4, R7, R9, R12, and R14 may still be refreshed, but at a later time and may be based on subsequent refresh commands (e.g., a fourth refresh command, which is not shown, or locally by the associated memory device). By skipping one or more pumps of a refresh command, a duration associated with refreshing a particular row or rows of memory cells (e.g., rows R2, R4, R7, R9, R12, and R14) may be increased.

Figure 6:
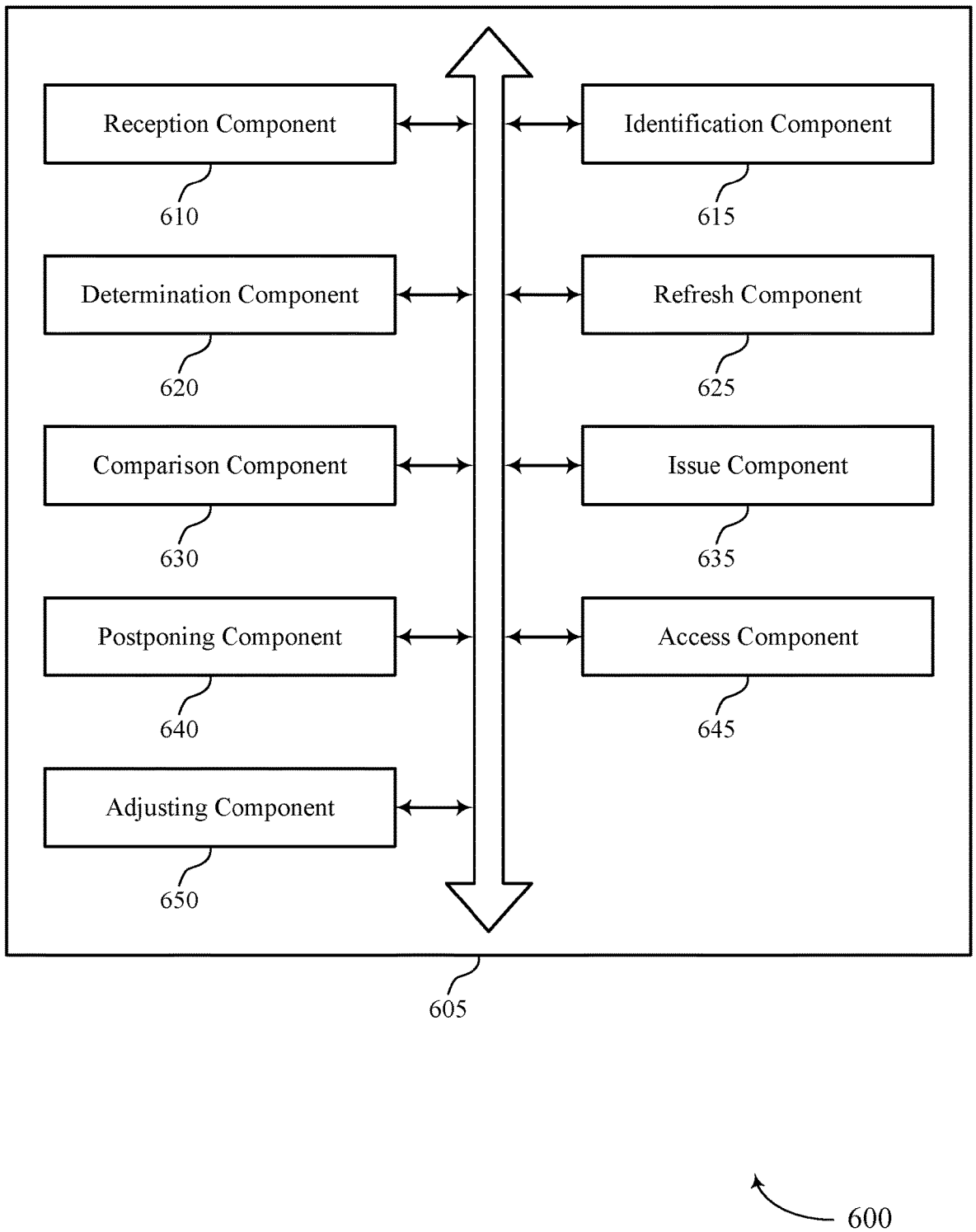
FIG. 6 shows a block diagram that supports refresh command management as disclosed herein.

FIG. 6 shows a block diagram 600 of a refresh command manager 605 that supports refresh command management as disclosed herein. The refresh command manager 605 may be an example of aspects of a system 300 or a system 400 as described with reference to FIGS. 3 and 4, respectively. In some cases, the refresh command manager 605 may be an example of a memory controller 105, a device memory controller 155, a local memory controller 165 or 265, or a combination thereof as described with reference to FIGS. 1 and 2. The refresh command manager 605 may include a reception component 610, an identification component 615, a determination component 620, a refresh component 625, a comparison component 630, an issue component 635, a postponing component 640, an access component 645, and an adjusting component 650. Each of these modules may communicate, directly or indirectly, with one another (e.g., via one or more buses).

The reception component 610 may receive, from a host device, a command for refreshing a set of memory cells of a memory die. In some examples, the reception component 610 may receive, from a host device, a set of commands for refreshing at least one memory cell of a memory die.

The identification component 615 may identify a set of events for the memory die based on receiving the command from the host device. In some examples, the identification component 615 may identify a temperature of each memory die of a set of memory dies. In some examples, the identification component 615 may identify a second temperature of the memory die.

The determination component 620 may determine a parameter for postponing and/or skipping one or more events of the set based on a temperature of the memory die and receiving the command. In some examples, the determination component 620 may determine a set of events for refreshing the at least one memory cell of the memory die based on a temperature of the memory die. In some examples, the determination component 620 may determine a parameter for postponing and/or skipping one or more refresh events at the memory die based on a count of the commands of the set of commands and a count of events of the set of events.

In some examples, the determination component 620 may determine a set of parameters for postponing and/or skipping the one or more events of each memory die of the set of memory dies based on the temperature of the respective memory die. In some examples, the determination component 620 may determine a second parameter for postponing and/or skipping the one or more events of the set based on the second temperature, where refreshing the at least one memory cell is based on the second parameter. In some examples, the determination component 620 may determine a difference between the count of commands and the count of events based on the comparison, where determining the parameter is based on the difference between the count of commands and the count of events.

The refresh component 625 may refresh at least one memory cell of the memory die based at least on part on the command and the parameter. In some examples, the refresh component 625 may refresh the at least one memory cell of the memory die based at least on part on the parameter. In some examples, the refresh component 625 may refresh a first set of memory cells of the memory die based on receiving the command. In some examples, the refresh component 625 may refresh at least one memory cell of each memory die based on determining the plurality of parameters.

The comparison component 630 may compare the temperature of the memory die with an indication of a refresh rate associated with the memory die, where determining the parameter is based on the comparison. In some examples, the comparison component 630 may compare the count of commands and the count of events.

The issue component 635 may issue a first set of events of the set of events based on receiving the command and determining the parameter, where refreshing the at least one memory cell is based on issuing the first set of events. In some examples, the issue component 635 may issue a second set of events configured to disable a subset of pumps of the memory die.

The postponing component 640 may refrain from refreshing a second set of memory cells of the memory die based on the parameter, where refreshing the at least one memory cell is based on refreshing the first set of memory cells and refraining from refreshing the second set of memory cells. In some examples, the postponing component 640 may stagger events that are postponed and/or skipped for each memory die of the set of memory dies, where the parameters for postponing and/or skipping one or more events of the set of memory dies indicate a staggered pattern for postponing and/or skipping the events. In some examples, the postponing component 640 may postpone and/or skip at least one of the one or more refresh events applied to the memory die when the count of commands exceeds the count of events.

The access component 645 may perform an operation different than a refresh operation with portions of the memory die that are postponing and/or skipping one or more of the events based on the parameter.

The adjusting component 650 may adjust a rate of refreshing the at least one memory cell of the memory die based on the parameter, where refreshing the at least one memory cell is based on adjusting the rate of refreshing.

Figure 7:
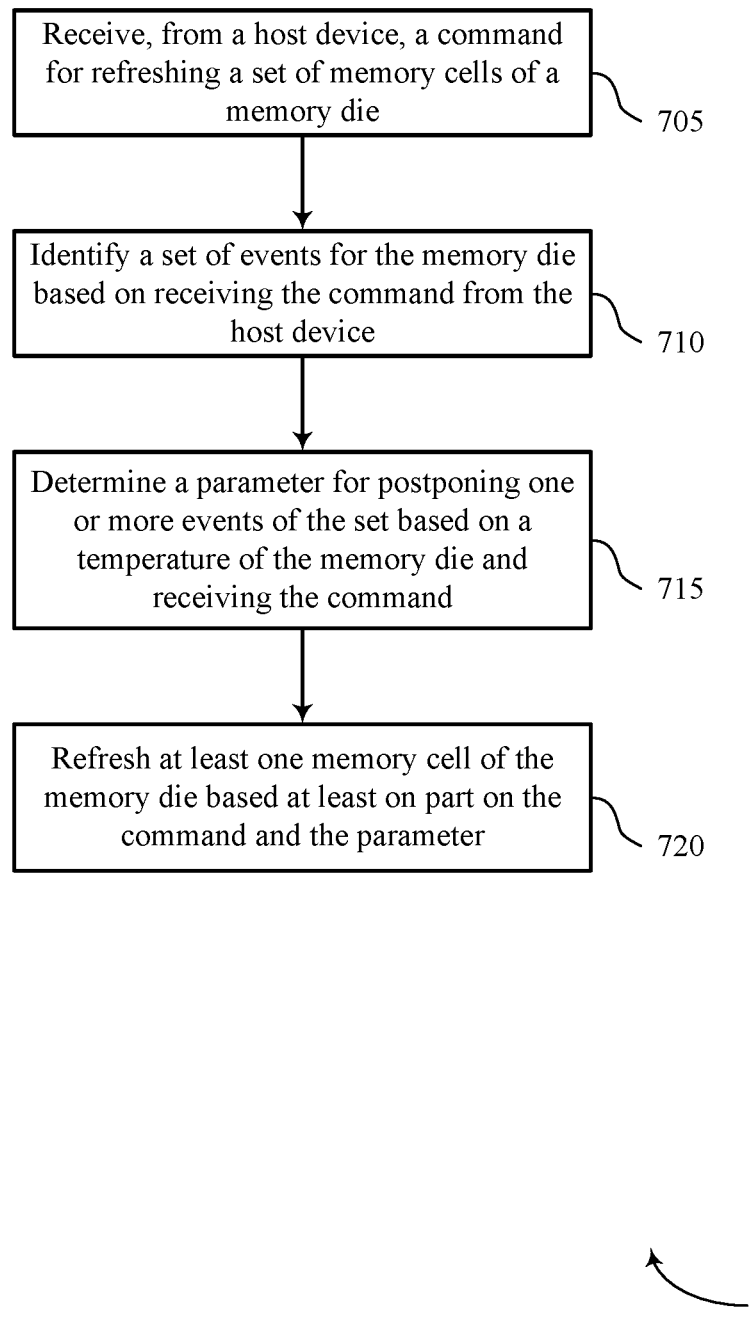
FIGS. 7 through 11 show flowcharts illustrating a method or methods that support refresh command management as disclosed herein.

FIG. 7 shows a flowchart illustrating a method 700 that supports refresh command management as disclosed herein. The operations of method 700 may be implemented by a controller or its components as described herein. For example, the operations of method 700 may be performed by a refresh command manager as described with reference to FIG. 6. In some examples, a memory controller may execute a set of instructions to control the functional elements of the memory die to perform the described functions. Additionally or alternatively, a memory die may perform aspects of the described functions using special-purpose hardware.

At 705, the memory die may receive, from a host device, a command for refreshing a set of memory cells of a memory die. The operations of 705 may be performed according to the methods described herein. In some examples, aspects of the operations of 705 may be performed by a reception component as described with reference to FIG. 6.

At 710, the memory die may identify a set of events for the memory die based on receiving the command from the host device. The operations of 710 may be performed according to the methods described herein. In some examples, aspects of the operations of 710 may be performed by an identification component as described with reference to FIG. 6.

At 715, the memory die may determine a parameter for postponing and/or skipping one or more events of the set based on a temperature of the memory die and receiving the command. The operations of 715 may be performed according to the methods described herein. In some examples, aspects of the operations of 715 may be performed by a determination component as described with reference to FIG. 6.

At 720, the memory die may refresh at least one memory cell of the memory die based at least on part on the command and the parameter. The operations of 720 may be performed according to the methods described herein. In some examples, aspects of the operations of 720 may be performed by a refresh component as described with reference to FIG. 6.

In some examples, an apparatus as described herein may perform a method or methods, such as method 700. The apparatus may include features, means, or instructions (e.g., a non-transitory computer-readable medium storing instructions executable by a processor) for receiving, from a host device, a command for refreshing a plurality of memory cells of a memory die, identifying a plurality of events for the memory die based at least in part on receiving the command from the host device, determining a parameter for postponing and/or skipping one or more events of the plurality based at least in part on a temperature of the memory die and receiving the command, and refreshing at least one memory cell of the memory die based at least on part on the command and the parameter.

Some examples of the methods, apparatuses, and non-transitory computer-readable medium described herein may further include operations, features, means, or instructions for comparing the temperature of the memory die with an indication of a refresh rate associated with the memory die, wherein determining the parameter is based at least in part on the comparison.

Some examples of the methods, apparatuses, and non-transitory computer-readable medium described herein may further include operations, features, means, or instructions for refreshing a first set of memory cells of the memory die based at least in part on receiving the command and refraining from refreshing a second set of memory cells of the memory die based at least in part on the parameter, wherein refreshing the at least one memory cell is based at least in part on refreshing the first set of memory cells and refraining from refreshing the second set of memory cells.

Some examples of the methods, apparatuses, and non-transitory computer-readable medium described herein may further include operations, features, means, or instructions for issuing a first set of events of the plurality of events based at least in part on receiving the command and determining the parameter, wherein refreshing the at least one memory cell is based at least in part on issuing the first set of events.

Some examples of the methods, apparatuses, and non-transitory computer-readable medium described herein may further include operations, features, means, or instructions for issuing a second set of events configured to disable a subset of pumps of the memory die.

In some examples of the methods, apparatuses, and non-transitory computer-readable medium described herein, postponing and/or skipping one or more events of the plurality of events comprises skipping one or more events of the plurality of events.

In some examples of the methods, apparatuses, and non-transitory computer-readable medium described herein, the at least one memory cell is associated with at least one pump of the memory die, wherein the at least one pump is associated with a row address of the plurality of memory cells.

Some examples of the methods, apparatuses, and non-transitory computer-readable medium described herein may further include operations, features, means, or instructions for identifying a temperature of each memory die of a plurality of memory dies, determining a plurality of parameters for postponing and/or skipping the one or more events of each memory die of the plurality of memory dies based at least in part on the temperature of the respective memory die, and refreshing at least one memory cell of each memory die based at least in part on determining the plurality of parameters.

In some examples of the methods, apparatuses, and non-transitory computer-readable medium described herein, a parameter for postponing and/or skipping one or more events of a first memory die of the plurality of memory dies is determined independent of a parameter for postponing and/or skipping one or more events of a second memory die of the plurality of memory dies based at least in part on the temperature of the first memory die and the temperature of the second memory die.

Some examples of the methods, apparatuses, and non-transitory computer-readable medium described herein may further include operations, features, means, or instructions for staggering events that are postponed and/or skipped for each memory die of the plurality of memory dies, wherein the parameters for postponing and/or skipping one or more events of the plurality of memory dies indicate a staggered pattern for postponing and/or skipping the events.

Some examples of the methods, apparatuses, and non-transitory computer-readable medium described herein may further include operations, features, means, or instructions for identifying a second temperature of the memory die and determining a second parameter for postponing and/or skipping the one or more events of the plurality based at least in part on the second temperature, wherein refreshing the at least one memory cell is based at least in part on the second parameter.

Some examples of the methods, apparatuses, and non-transitory computer-readable medium described herein may further include operations, features, means, or instructions for performing an operation different than a refresh operation with portions of the memory die that are postponing and/or skipping one or more of the events based at least in part on the parameter.

In some examples of the methods, apparatuses, and non-transitory computer-readable medium described herein, an event of the plurality of events comprises refreshing one or more rows of memory cells of the memory die.

Figure 8:
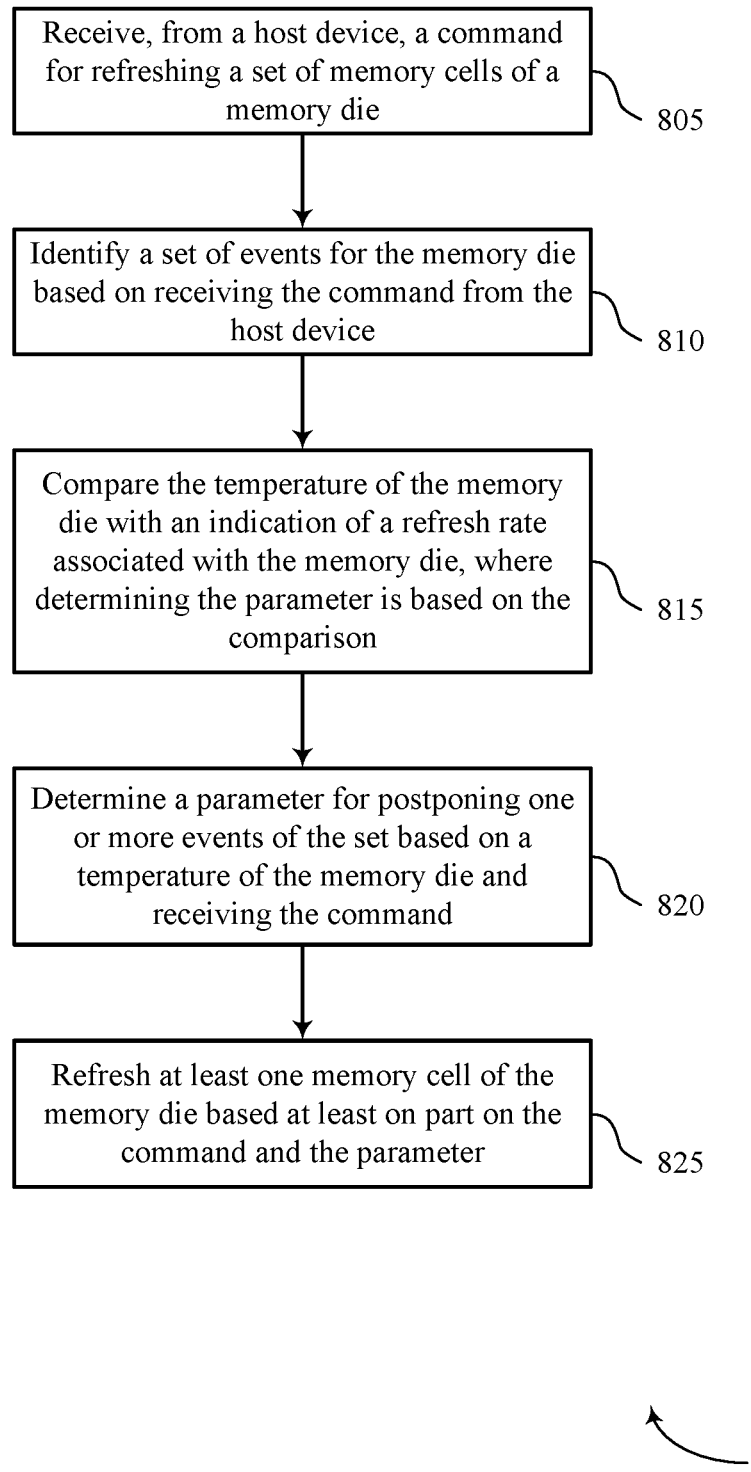

FIG. 8 shows a flowchart illustrating a method 800 that supports refresh command management as disclosed herein. The operations of method 800 may be implemented by a controller or its components as described herein. For example, the operations of method 800 may be performed by a refresh command manager as described with reference to FIG. 6. In some examples, a memory controller may execute a set of instructions to control the functional elements of the memory die to perform the described functions. Additionally or alternatively, a memory die may perform aspects of the described functions using special-purpose hardware.

At 805, the memory die may receive, from a host device, a command for refreshing a set of memory cells of a memory die. The operations of 805 may be performed according to the methods described herein. In some examples, aspects of the operations of 705 may be performed by a reception component as described with reference to FIG. 6.

At 810, the memory die may identify a set of events for the memory die based on receiving the command from the host device. The operations of 810 may be performed according to the methods described herein. In some examples, aspects of the operations of 810 may be performed by an identification component as described with reference to FIG. 6

At 815, the memory die may compare the temperature of the memory die with an indication of a refresh rate associated with the memory die, where determining the parameter is based on the comparison. The operations of 815 may be performed according to the methods described herein. In some examples, aspects of the operations of 815 may be performed by a comparison component as described with reference to FIG. 6.

At 820, the memory die may determine a parameter for postponing and/or skipping one or more events of the set based on a temperature of the memory die and receiving the command. The operations of 820 may be performed according to the methods described herein. In some examples, aspects of the operations of 820 may be performed by a determination component as described with reference to FIG. 6

At 825, the memory die may refresh at least one memory cell of the memory die based at least on part on the command and the parameter. The operations of 825 may be performed according to the methods described herein. In some examples, aspects of the operations of 825 may be performed by a refresh component as described with reference to FIG. 6.

Figure 9:
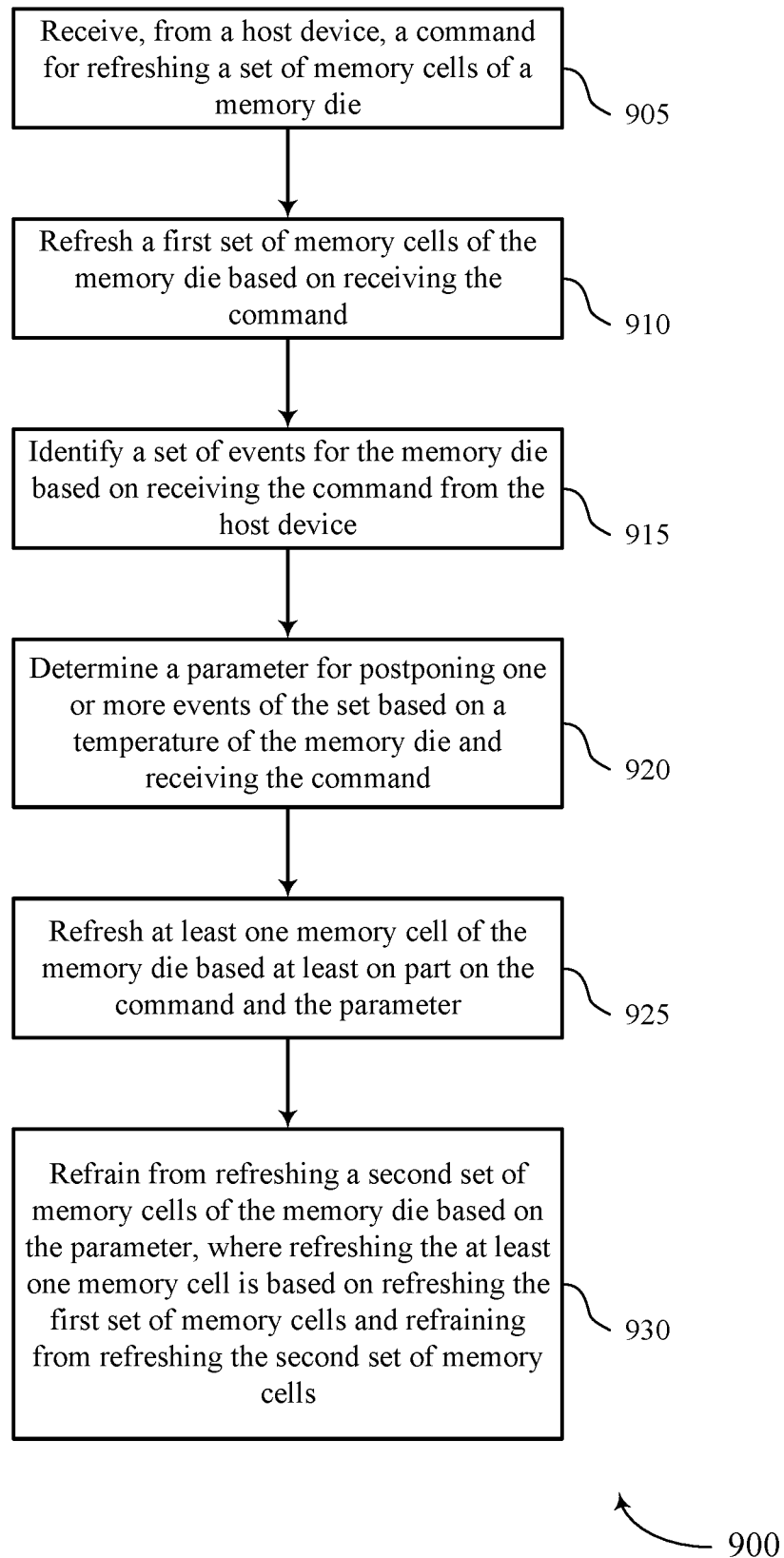

FIG. 9 shows a flowchart illustrating a method 900 that supports refresh command management as disclosed herein. The operations of method 900 may be implemented by a memory controller or its components as described herein. For example, the operations of method 900 may be performed by a refresh command manager as described with reference to FIG. 6. In some examples, a memory controller may execute a set of instructions to control the functional elements of the memory die to perform the described functions. Additionally or alternatively, a memory die may perform aspects of the described functions using special-purpose hardware.

At 905, the memory die may receive, from a host device, a command for refreshing a set of memory cells of a memory die. The operations of 905 may be performed according to the methods described herein. In some examples, aspects of the operations of 905 may be performed by a reception component as described with reference to FIG. 6.

At 910, the memory die may refresh a first set of memory cells of the memory die based on receiving the command. The operations of 910 may be performed according to the methods described herein. In some examples, aspects of the operations of 910 may be performed by a refresh component as described with reference to FIG. 6.

At 915, the memory die may identify a set of events for the memory die based on receiving the command from the host device. The operations of 915 may be performed according to the methods described herein. In some examples, aspects of the operations of 915 may be performed by an identification component as described with reference to FIG. 6.

At 920, the memory die may determine a parameter for postponing and/or skipping one or more events of the set based on a temperature of the memory die and receiving the command. The operations of 920 may be performed according to the methods described herein. In some examples, aspects of the operations of 920 may be performed by a determination component as described with reference to FIG. 6.

At 925, the memory die may refresh at least one memory cell of the memory die based at least on part on the command and the parameter. The operations of 925 may be performed according to the methods described herein. In some examples, aspects of the operations of 925 may be performed by a refresh component as described with reference to FIG. 6.

At 930, the memory die may refrain from refreshing a second set of memory cells of the memory die based on the parameter, where refreshing the at least one memory cell is based on refreshing the first set of memory cells and refraining from refreshing the second set of memory cells. The operations of 930 may be performed according to the methods described herein. In some examples, aspects of the operations of 930 may be performed by a postponing component as described with reference to FIG. 6.

Figure 10:
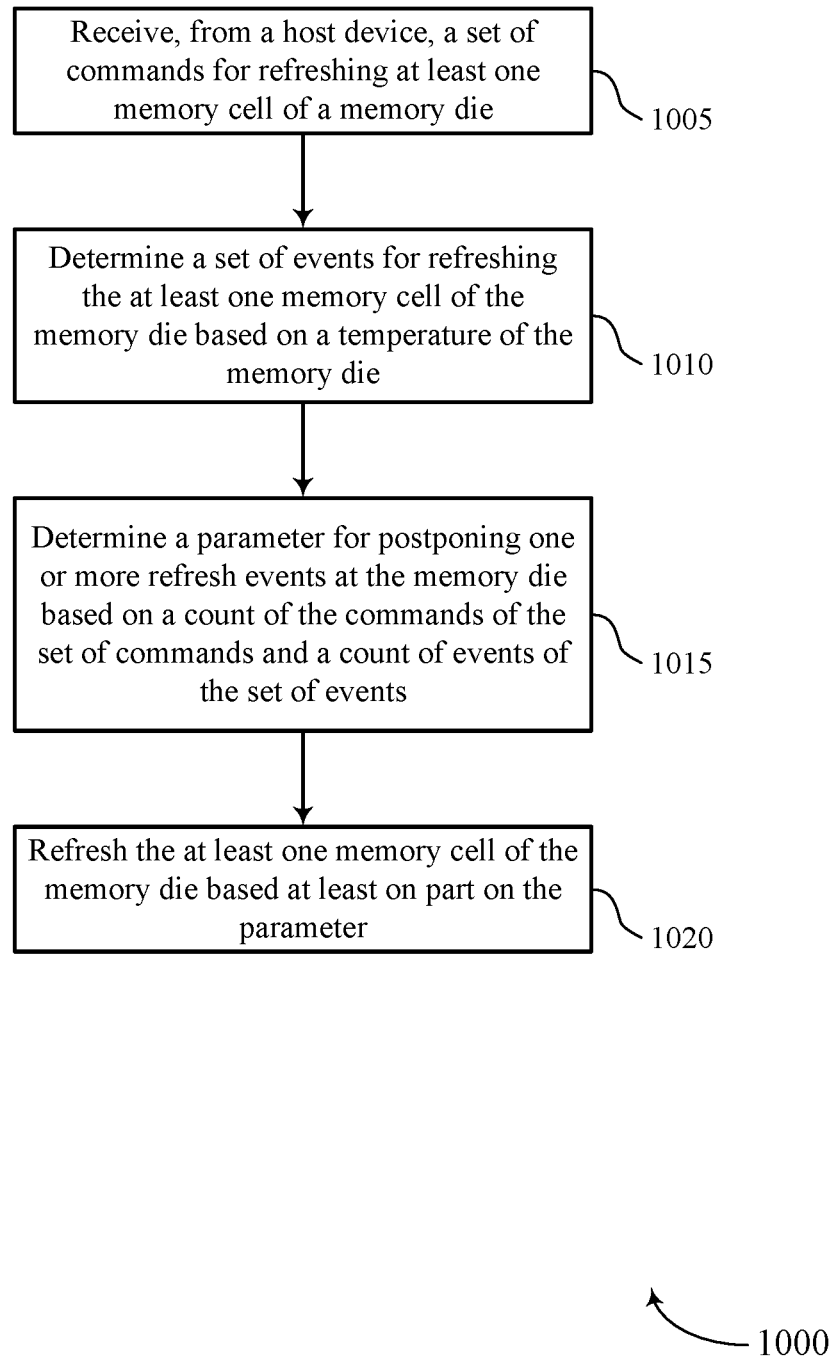

FIG. 10 shows a flowchart illustrating a method 1000 that supports refresh command management as disclosed herein. The operations of method 1000 may be implemented by a memory controller or its components as described herein. For example, the operations of method 1000 may be performed by a refresh command manager as described with reference to FIG. 6. In some examples, a memory controller may execute a set of instructions to control the functional elements of the memory die to perform the described functions. Additionally or alternatively, a memory die may perform aspects of the described functions using special-purpose hardware.

At 1005, the memory die may receive, from a host device, a set of commands for refreshing at least one memory cell of a memory die. The operations of 1005 may be performed according to the methods described herein. In some examples, aspects of the operations of 1005 may be performed by a reception component as described with reference to FIG. 6.

At 1010, the memory die may determine a set of events for refreshing the at least one memory cell of the memory die based on a temperature of the memory die. The operations of 1010 may be performed according to the methods described herein. In some examples, aspects of the operations of 1010 may be performed by a determination component as described with reference to FIG. 6.

At 1015, the memory die may determine a difference between the count of commands and the count of events based on the comparison, where determining the parameter is based on the difference between the count of commands and the count of events. The operations of 1015 may be performed according to the methods described herein. In some examples, aspects of the operations of 1015 may be performed by a determination component as described with reference to FIG. 6.

At 1020, the memory die may refresh the at least one memory cell of the memory die based at least on part on the parameter. The operations of 1020 may be performed according to the methods described herein. In some examples, aspects of the operations of 1020 may be performed by a refresh component as described with reference to FIG. 6.

In some examples, an apparatus as described herein may perform a method or methods, such as method 1000. The apparatus may include features, means, or instructions (e.g., a non-transitory computer-readable medium storing instructions executable by a processor) for receiving, from a host device, a plurality of commands for refreshing at least one memory cell of a memory die, determining a plurality of events for refreshing the at least one memory cell of the memory die based at least in part on a temperature of the memory die, determining a parameter for postponing and/or skipping one or more refresh events at the memory die based at least in part on a count of commands of the plurality of commands and a count of events of the plurality of events, and refreshing the at least one memory cell of the memory die based at least on part on the parameter.

Some examples of the methods, apparatuses, and non-transitory computer-readable medium described herein may further include operations, features, means, or instructions for comparing the count of commands and the count of events and determining a difference between the count of commands and the count of events based at least in part on the comparison, wherein determining the parameter is based at least in part on the difference between the count of commands and the count of events.

Some examples of the methods, apparatuses, and non-transitory computer-readable medium described herein may further include operations, features, means, or instructions for adjusting a rate of refreshing the at least one memory cell of the memory die based at least in part on the parameter, wherein refreshing the at least one memory cell is based at least in part on adjusting the rate of refreshing.

Some examples of the methods, apparatuses, and non-transitory computer-readable medium described herein may further include operations, features, means, or instructions for postponing and/or skipping at least one of the one or more refresh events applied to the memory die when the count of commands exceeds the count of events.

In some examples of the methods, apparatuses, and non-transitory computer-readable medium described herein, the at least one memory cell is associated with at least one pump of the memory die, wherein the at least one pump is associated with a row address of the plurality of memory cells.

Figure 11:
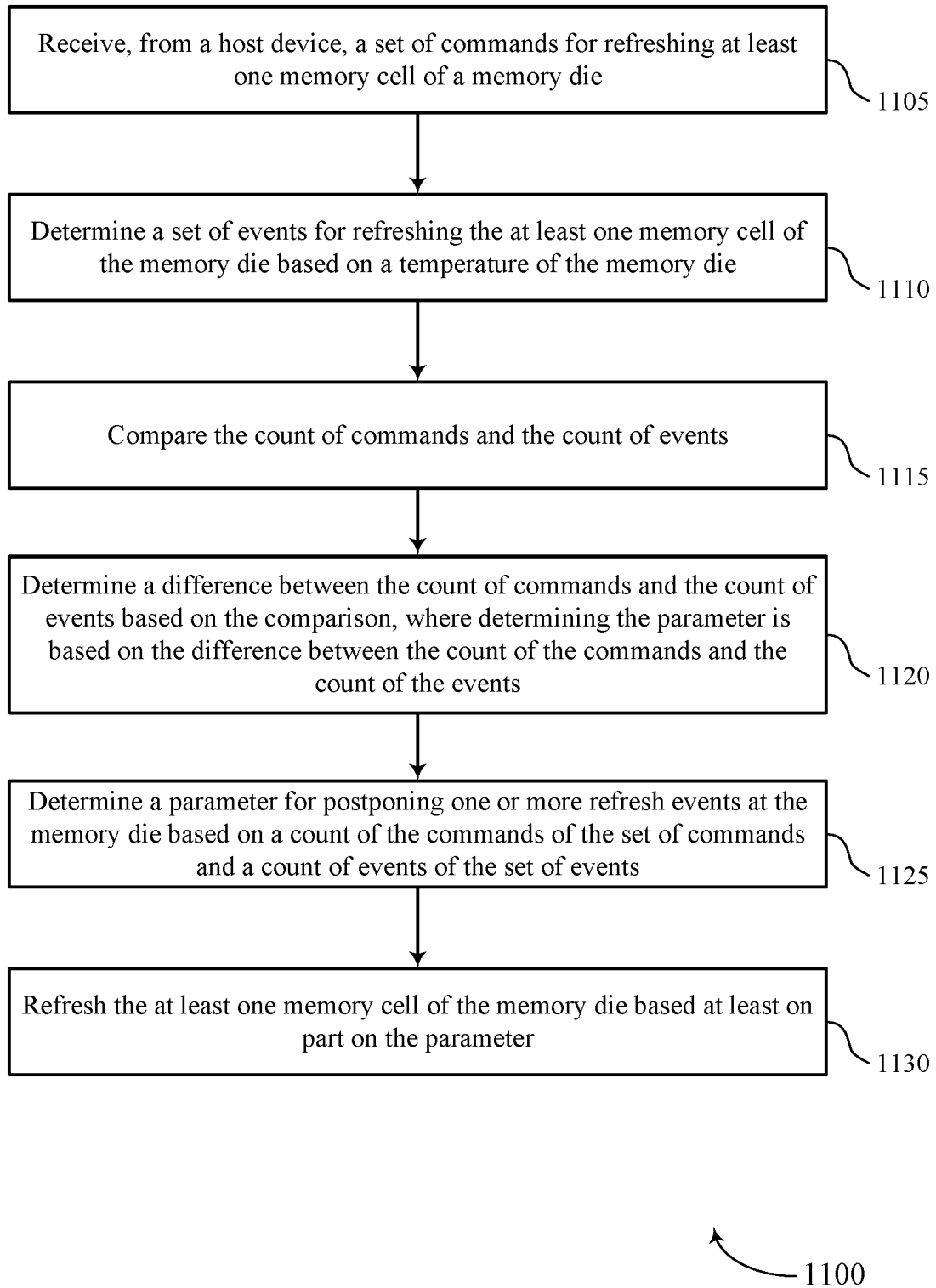

FIG. 11 shows a flowchart illustrating a method 1100 that supports refresh command management as disclosed herein. The operations of method 1100 may be implemented by a memory controller or its components as described herein. For example, the operations of method 1100 may be performed by a refresh command manager as described with reference to FIG. 6. In some examples, a memory controller may execute a set of instructions to control the functional elements of the memory die to perform the described functions. Additionally or alternatively, a memory die may perform aspects of the described functions using special-purpose hardware.

At 1105, the memory die may receive, from a host device, a set of commands for refreshing at least one memory cell of a memory die. The operations of 1105 may be performed according to the methods described herein. In some examples, aspects of the operations of 1105 may be performed by a reception component as described with reference to FIG. 6.

At 1110, the memory die may determine a set of events for refreshing the at least one memory cell of the memory die based on a temperature of the memory die. The operations of 1110 may be performed according to the methods described herein. In some examples, aspects of the operations of 1110 may be performed by a determination component as described with reference to FIG. 6.

At 1115, the memory die may compare the count of commands and the count of events. The operations of 1115 may be performed according to the methods described herein. In some examples, aspects of the operations of 1115 may be performed by a comparison component as described with reference to FIG. 6.

At 1120, the memory die may determine a difference between the count of commands and the count of events based on the comparison, where determining the parameter is based on the difference between the count of commands and the count of events. The operations of 1120 may be performed according to the methods described herein. In some examples, aspects of the operations of 1120 may be performed by a determination component as described with reference to FIG. 6.

At 1125, the memory die may determine a parameter for postponing and/or skipping one or more refresh events at the memory die based on a count of the commands of the set of commands and a count of events of the set of events. The operations of 1125 may be performed according to the methods described herein. In some examples, aspects of the operations of 1125 may be performed by a determination component as described with reference to FIG. 6.

At 1130, the memory die may refresh the at least one memory cell of the memory die based at least on part on the parameter. The operations of 1130 may be performed according to the methods described herein. In some examples, aspects of the operations of 1130 may be performed by a refresh component as described with reference to FIG. 6.

It should be noted that the methods described above describe possible implementations, and that the operations and the steps may be rearranged or otherwise modified and that other implementations are possible. Furthermore, aspects from two or more of the methods may be combined.

In some examples, an apparatus or device may perform aspects of the functions described herein. The device may include a register for storing a plurality of commands for refreshing a plurality of memory cells of a memory die, a logic component coupled with the register, the logic component for identifying a temperature of the memory die and determining a parameter for postponing and/or skipping one or more commands of the plurality, and a control component coupled with the logic component, the control component for refreshing at least one memory cell of the memory die based at least in part on the parameter.

In some examples, the logic component may be configured to determine the parameter for postponing and/or skipping the one or more commands by comparing the temperature of the memory die with an indication of a refresh rate associated with the memory die.

In some examples, the control component may be configured to refresh the at least one memory cell of the memory die by issuing a plurality of events associated with a different refresh rate than a refresh rate of the memory die.

In some examples, the control component may be configured to refresh the at least one memory cell of the memory die by issuing a third command to the plurality of memory cells of the memory die to disable a subset of pumps of the memory die.

In some examples, the logic component may be configured to perform an operation different than a refresh operation with portions of the memory die that are postponing and/or skipping one or more of the commands based at least in part on the parameter.

In some examples, an apparatus or device may perform aspects of the functions described herein. The device may include a first counter for identifying a quantity of commands received from a host device during a duration, the commands for refreshing a plurality of memory cells of a memory die, a second counter for identifying a quantity of events for refreshing the plurality of memory cells of the memory die determined during the duration, the events determined based at least in part on a temperature of the memory die, and a logic component coupled with the first counter and the second counter, the logic component for determining a parameter for postponing and/or skipping one or more refresh events associated with the memory die based at least in part on an output of the first counter and an output of the second counter.

In some examples, the logic component may be configured to compare the first counter of the commands and the second counter of the events and determine a difference between the quantity of commands and the quantity of events, wherein determining the parameter is based at least in part on the difference between the quantity of commands and the quantity of the events.

In some examples, the logic component may be configured to refresh at least one memory cell of the memory die by applying at least one of the events to the at least one memory cell when the quantity of commands exceeds the quantity of events.

In some examples, the logic component may be configured to refresh at least one memory cell of the memory die by applying at least one of the commands to the at least one memory cell when the quantity of events exceeds the quantity of commands.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving, from a host device, a command for initiating a refresh operation that comprises selectively refreshing a plurality of memory cells of a memory die, the refresh operation comprising a plurality of refresh events for the memory die;
   identifying a temperature of the memory die based at least in part on receiving the command;
   determining a parameter for postponing a first portion of refresh events of the plurality of refresh events of the refresh operation based at least in part on the temperature of the memory die and receiving the command; and
   refreshing at least one memory cell associated with the first portion of refresh events at a first refresh rate based at least on part on the parameter and refreshing at least one memory cell associated with a second portion of refresh events of the plurality of refresh events at a second refresh rate.

2. The method of claim 1, further comprising:
   comparing the temperature of the memory die with an indication of a refresh rate associated with the memory die, wherein determining the parameter is based at least in part on the comparison.

3. The method of claim 1, further comprising:
   refreshing a first set of memory cells of the memory die based at least in part on receiving the command; and
   refraining from refreshing a second set of memory cells of the memory die based at least in part on the parameter, wherein refreshing the at least one memory cell associated with the first portion of refresh events at the first rate is based at least in part on refreshing the first set of memory cells and refraining from refreshing the second set of memory cells.

4. The method of claim 1, further comprising:
   issuing a first set of refresh events of the plurality of refresh events based at least in part on receiving the command and determining the parameter, wherein refreshing the at least one memory cell associated with the first portion of refresh events at the first rate is based at least in part on issuing the first set of refresh events.

5. The method of claim 1, wherein postponing the first portion of refresh events of the plurality of refresh events comprises skipping one or more refresh events of the plurality of refresh events.

6. The method of claim 1, wherein the at least one memory cell is associated with at least one pump of the memory die, wherein the at least one pump is associated with a row address of the plurality of memory cells.

7. The method of claim 1, further comprising:
   identifying a temperature of each memory die of a plurality of memory dies;
   determining a plurality of parameters for postponing the first portion of refresh events of each memory die of the plurality of memory dies based at least in part on the temperature of the respective memory die; and
   refreshing at least one memory cell of each memory die based at least in part on determining the plurality of parameters.

8. The method of claim 7, wherein a parameter for postponing the first portion of refresh events of a first memory die of the plurality of memory dies is determined independent of a parameter for postponing the first portion of refresh events of a second memory die of the plurality of memory dies based at least in part on the temperature of the first memory die and the temperature of the second memory die.

9. The method of claim 7, further comprising:
   staggering refresh events that are postponed for each memory die of the plurality of memory dies, wherein the parameters for postponing the first portion of refresh events of the plurality of memory dies indicate a staggered pattern for postponing the refresh events.

10. The method of claim 1, further comprising:
    identifying a second temperature of the memory die; and
    determining a second parameter for postponing the first portion of more refresh events of the plurality based at least in part on the second temperature, wherein refreshing the at least one memory cell is based at least in part on the second parameter.

11. The method of claim 1, further comprising:
    performing an operation different than a refresh operation with portions of the memory die that are postponing the first portion of the refresh events based at least in part on the parameter.

12. The method of claim 1, wherein an event of the plurality of refresh events comprises refreshing one or more rows of memory cells of the memory die.

13. A method, comprising:
    receiving, from a host device, a plurality of commands for refreshing at least one memory cell of a memory die;
    determining a plurality of events for refreshing the at least one memory cell of the memory die based at least in part on a temperature of the memory die;
    determining a parameter for postponing a first portion of refresh events at the memory die based at least in part on a comparison of a count of commands of the plurality of commands and a count of events of the plurality of events; and
    refreshing at least one memory cell of the memory die associated with the first portion of refresh events at a first refresh rate based at least on part on the parameter and refreshing at least one memory cell associated with a second portion of refresh events at a second refresh rate.

14. The method of claim 13, further comprising:
    determining a difference between the count of commands and the count of events based at least in part on the comparison, wherein determining the parameter is based at least in part on the difference between the count of commands and the count of events.

15. The method of claim 14, further comprising:
    adjusting a rate of refreshing the at least one memory cell of the memory die associated with the first portion of refresh events based at least in part on the parameter, wherein refreshing the at least one memory cell associated with the first portion of refresh events is based at least in part on adjusting the rate of refreshing.

16. The method of claim 13, further comprising:
postponing at least one of the one or more refresh events applied to the memory die when the count of commands exceeds the count of events.

17. The method of claim 13, wherein the at least one memory cell associated with the first portion of refresh events and the at least one memory cell associated with the second portion of refresh events are each associated with at least one pump of the memory die, wherein the at least one pump is associated with a row address of the plurality of memory cells.

18. An apparatus, comprising:
a register configured to store a quantity of a plurality of refresh commands for initiating a refresh operation that comprises selectively refreshing a plurality of memory cells of a memory die, the refresh operation comprising a plurality of refresh events for the memory die;
first logic coupled with the register, the first logic configured to identify a temperature of the memory die and determine a parameter for postponing a first portion of refresh events associated with a refresh command of the plurality of refresh commands; and
second logic coupled with the first logic, the second logic configured to selectively refresh at least one memory cell associated with the first portion of refresh events at a first refresh rate based at least in part on the parameter and refreshing at least one memory cell associated with a second portion of refresh events of the plurality of refresh events at a second refresh rate.

19. The apparatus of claim 18, wherein the first logic is configured to:
determine the parameter for postponing the first portion of refresh events associated with the refresh commands by comparing the temperature of the memory die with an indication of a refresh rate associated with the memory die.

20. The apparatus of claim 18, wherein the second logic is configured to:
selectively refresh the at least one memory cell of the memory die associated with the first portion of refresh events by issuing a plurality of refresh events associated with a different refresh rate than a refresh rate of the memory die.

21. The apparatus of claim 18, wherein the second logic is configured to:
selectively refresh the at least one memory cell of the memory die by issuing a third refresh command to the plurality of memory cells of the memory die to disable a subset of pumps of the memory die.

22. An apparatus, comprising:
a first counter for identifying a quantity of commands received from a host device during a duration, the commands for refreshing a plurality of memory cells of a memory die;
a second counter for identifying a quantity of events for refreshing the plurality of memory cells of the memory die determined during the duration, the events determined based at least in part on a temperature of the memory die; and
a logic component coupled with the first counter and the second counter, the logic component for determining a parameter for postponing a first portion of refresh events associated with the memory die at a first refresh rate based at least in part on a comparison of an output of the first counter and an output of the second counter and determining a parameter for postponing a second portion of refresh events associated with the memory die at a second refresh rate based at least in part on the comparison of the output of the first counter and the output of the second counter.

23. The apparatus of claim 22, wherein the logic component is configured to:
compare the first counter of the commands and the second counter of the events; and
determine a difference between the quantity of commands and the quantity of events, wherein determining the parameter for postponing the first portion of refresh events and the parameter for postponing the second portion of refresh events is based at least in part on the difference between the quantity of commands and the quantity of events.

24. The apparatus of claim 23, wherein the logic component is configured to:
refresh at least one memory cell of the memory die by applying at least one of the events to the at least one memory cell when the quantity of commands exceeds the quantity of events.

25. The apparatus of claim 23, wherein the logic component is configured to:
refresh at least one memory cell of the memory die by applying at least one of the commands to the at least one memory cell when the quantity of events exceeds the quantity of commands.

* * * * *